(12) United States Patent
Holt

(10) Patent No.: US 8,620,606 B2
(45) Date of Patent: Dec. 31, 2013

(54) TRANSMITTER POWER MONITOR

(75) Inventor: Timothy Lee Holt, Chardon, OH (US)

(73) Assignee: Bird Technologies Group Inc., Solon, OH (US)

( * ) Notice: Subject to any disclaimer, the term of this patent is extended or adjusted under 35 U.S.C. 154(b) by 224 days.

(21) Appl. No.: 12/736,410

(22) PCT Filed: Apr. 7, 2009

(86) PCT No.: PCT/US2009/002169
§ 371 (c)(1),
(2), (4) Date: Oct. 25, 2010

(87) PCT Pub. No.: WO2009/126254
PCT Pub. Date: Oct. 15, 2009

(65) Prior Publication Data
US 2011/0119001 A1    May 19, 2011

Related U.S. Application Data

(60) Provisional application No. 61/123,830, filed on Apr. 11, 2008.

(51) Int. Cl.
*G01R 35/00* (2006.01)

(52) U.S. Cl.
USPC .......................................................... 702/60

(58) Field of Classification Search
USPC .......................................................... 702/60
See application file for complete search history.

(56) References Cited

U.S. PATENT DOCUMENTS

| 3,634,784 A | 1/1972 | Lesyk et al. |
| 3,958,244 A | 5/1976 | Lee et al. |
| 4,070,619 A | 1/1978 | Trefney |
| 4,075,554 A | 2/1978 | Mecklenberg |
| 4,080,566 A | 3/1978 | Mecklenburg |
| 4,096,441 A | 6/1978 | Schwartz |
| 4,137,499 A | 1/1979 | Caudel |

(Continued)

FOREIGN PATENT DOCUMENTS

| EP | 104748 A1 | 4/1984 |
| JP | 60-107901 A | 6/1985 |

(Continued)

OTHER PUBLICATIONS

OP-AMP Basics , printed Apr. 30, 2013, 3 pages.*

(Continued)

*Primary Examiner* — Tung S Lau

(74) *Attorney, Agent, or Firm* — Wegman, Hessler & Vanderburg

(57) ABSTRACT

The invention provides an in-line power monitor for an RF transmission line that is capable of being calibrated in-line during live conditions at the exact power level and frequency where it is used. This device uses forward and reflected directional couplers and a non-directional coupler to sample the RF voltage on the transmission line. The RF voltage of the forward and reflected channels are each split into two paths, one going to a test port and the other leading to additional circuitry which prepares the signals of the forward and reflected channels for output to power displays. Additionally, the monitor allows the user to compensate for any voltage offsets introduced by various circuitry components. Further, the monitor also allows to user to individually calibrate the output of the forward and reflected channels by applying an adjustable gain ratio correction to each channel.

14 Claims, 20 Drawing Sheets

(56) References Cited

U.S. PATENT DOCUMENTS

| | | |
|---|---|---|
| 4,165,493 A | 8/1979 | Harrington |
| 4,263,653 A | 4/1981 | Mecklenburg |
| 4,274,156 A | 6/1981 | Trefney |
| 4,447,783 A | 5/1984 | Quick |
| 4,547,728 A | 10/1985 | Mecklenburg |
| 4,570,117 A | 2/1986 | Holt |
| 4,628,256 A | 12/1986 | Powell |
| 5,812,941 A | 9/1998 | Cho |
| 5,949,380 A | 9/1999 | Swank, II |
| 6,236,840 B1 | 5/2001 | Aihara et al. |
| 6,259,912 B1 | 7/2001 | Si |
| 6,275,684 B1 | 8/2001 | Kaneko et al. |
| 6,289,216 B1 | 9/2001 | Koh et al. |
| 6,339,702 B1 | 1/2002 | Izumiyama |
| 6,356,744 B1 | 3/2002 | Zamat |
| 6,396,879 B1 | 5/2002 | Yoshimura et al. |
| 6,534,966 B2 | 3/2003 | Zou |
| 6,591,089 B1 | 7/2003 | Ichihara |
| 6,603,960 B1 | 8/2003 | Oida et al. |
| 6,788,920 B1 | 9/2004 | Zamat |
| 6,859,102 B2 | 2/2005 | Tichauer |
| 6,859,646 B2 | 2/2005 | Khorram |
| 6,904,291 B2 | 6/2005 | Miyamoto et al. |
| 6,915,114 B2 | 7/2005 | Khorram |
| 7,054,598 B2 | 5/2006 | Bae |
| 7,054,603 B2 | 5/2006 | Khorram |
| 7,103,328 B2 | 9/2006 | Zelley |
| 7,127,220 B2 | 10/2006 | Abrams et al. |
| 7,171,179 B2 | 1/2007 | Zhou |
| 7,299,015 B2 | 11/2007 | Iwamiya et al. |
| 7,317,419 B2 | 1/2008 | Sugar et al. |
| 7,454,189 B2 | 11/2008 | Kim |
| 2002/0113600 A1 | 8/2002 | Swank, II |
| 2002/0113601 A1 | 8/2002 | Swank, II |
| 2004/0185809 A1* | 9/2004 | Jenkins ............... 455/127.2 |
| 2006/0122838 A1 | 6/2006 | Schindler et al. |
| 2007/0026812 A1 | 2/2007 | Hu et al. |
| 2008/0012644 A1 | 1/2008 | Lang et al. |
| 2008/0084199 A1 | 4/2008 | Hawkins et al. |

FOREIGN PATENT DOCUMENTS

| | | |
|---|---|---|
| JP | 03-296667 A | 12/1991 |
| JP | 09-027771 A | 1/1997 |
| JP | 2002135188 A | 5/2002 |
| JP | 2006-261797 A | 9/2006 |
| WO | WO 98/44661 A1 | 10/1998 |
| WO | WO 02/054092 A1 | 7/2002 |

OTHER PUBLICATIONS

Office Action dated Mar. 29, 2013 and English translation thereof for corresponding Japanese patent application No. 2011-503983.

\* cited by examiner

NOTES:

1. ADC Max Input = 2.5 V. Detector fullscale output between 1.25 and 2.0V

2. Temp = 0.5V @ 0°C, 0.75V @ 25°C, 1.0V @ 50°C

NOTES:

1. DAC Output Range = 0 - 5.0 Vdc. Fullscale voltage = 4V.

US 8,620,606 B2

TRANSMITTER POWER MONITOR

CROSS REFERENCE TO RELATED APPLICATION

This application claims the priority benefit of U.S. Provisional Patent Application Ser. No. 61/123,830 filed Apr. 11, 2008.

FIELD OF THE INVENTION

This invention relates to an electrical instrument for monitoring RF transmitters and transmission lines to measure and report values for both the forward and reflected transmission line power.

BACKGROUND OF THE INVENTION

The output power and resultant geographic coverage of radio and television broadcast transmission systems are regulated in the United States by the Federal Communications Commission ("FCC"). Title 47, Part 73.644 of the FCC rules and regulations regarding broadcast transmission states in part: "If electrical devices are used to determine the output power, such devices must permit determination of this power within an accuracy of ±5% of the power indicated by the full scale reading of the electrical indicating instrument of the device."

While in-line power measurement instruments are designed and manufactured such that they are capable of measuring transmission power to within ±5% at the time of shipment, all test instruments require periodic calibration in order to maintain their design performance levels and remain in compliance with FCC rules and regulations.

Calibration approaches for currently available power measurement instruments used in broadcast applications call for the removal of the power monitor from the transmission line so that it may be returned to the factory for calibration. The major issue associated with this process is that the transmitter must be shut down while the in-line power monitor is removed from the system and temporarily replaced with either a spare power monitor or a temporary transmission line section. Due to the inherent inconvenience associated with a transmitter shut down and equipment removal, most power monitors are either calibrated very infrequently or not calibrated altogether.

Another issue associated with the current factory calibration procedures is that most factories are not capable of calibrating power monitors at the exact power levels and frequencies they are used at in the field. Because the detectors in power monitors do not provide a uniform flatline response at every frequency and power level, factory calibrated power monitors are inherently inaccurate if not used at the factory calibrated power level and frequency. These inaccuracies coupled with a drift in the calibration over time can render monitors incapable of measuring transmission line power to within ±5%, taking them out of compliance with FCC rules and regulations.

In view of these limitations, a need exists for a power monitor that is capable of being calibrated in-line during live conditions at the exact power level and frequency where it is used.

The instrument of the present invention satisfies the needs described above and affords other features and advantages heretofore not obtainable.

SUMMARY OF THE INVENTION

This invention provides an electrical instrument for monitoring the forward and reflected RF power along a transmission line and is capable of being calibrated in-line during live conditions at the exact power and frequency where it is used.

In some embodiments, forward and reflected directional couplers are used to sample the forward and reflected voltage on the transmission line. The RF signals from the couplers are routed to a pair of power splitters, with one for each of the forward and reflected channels. Each power splitter provides a pair of outputs, one of which is sent to a test port, the other sent to a square-law diode detector circuit. The detector circuits convert the sampled forward and reflected transmission line RF voltages into small DC voltages.

The respective small DC voltages are each amplified by a precision gain stage, converted to digital signals by an analog to digital converter and sent to the system microcontroller. The microcontroller applies temperature correction and calibration scaling to the signals and produces digital outputs. The digital outputs are converted to analog signals by a digital to analog converter and directed to a precision buffer amplifier stage. Thereafter the signals are then made available to the user for remote monitoring via a male DE9 9-pin D-sub socket. The remote monitoring can be performed using forward and reflected power displays.

In some embodiments, the forward power measurement is in-line calibrated by connecting a reference power meter to the forward test port to measure the transmission line forward power, the attenuation data between the transmission line and the forward test port is inputted into the reference power meter, the reference power meter reading is compared to the forward power display, and the forward calibration adjustment is appropriately manipulated until the forward power display reading is substantially equivalent to the reference power meter reading.

In some embodiments, the reflected power measurement is in-line calibrated by connecting a reference power meter to the reflected test port to measure the transmission line reflected power, the attenuation data between the transmission line and the reflected test port is inputted into the reference power meter, the reference power meter reading is compared to the reflected power display, and the reflected calibration adjustment is appropriately manipulated until the reflected power display reading is substantially equivalent to the reference power meter reading.

Additionally, some embodiments are capable of calculating and compensating for any offsets introduced by the circuitry in the forward and reflected signal paths leading up to and including the microcontroller. The circuitry is "zeroed" by pressing and holding the calibration button with zero power in the transmission line, during which time the LED will blink. When the calibration button is released, the offsets are calculated for the individual forward and reflected channels and the offset compensation is applied to each channel.

Some embodiments also include a third non-directional coupler that provides a sample of the main line transmission voltage, but is not configured to provide directionality.

DETAILED DESCRIPTION OF THE INVENTION

Referring more particularly to the drawings, there is shown an embodiment of the invention, a transmitter power monitor capable of being calibrated while operating under live conditions.

Figure 1:
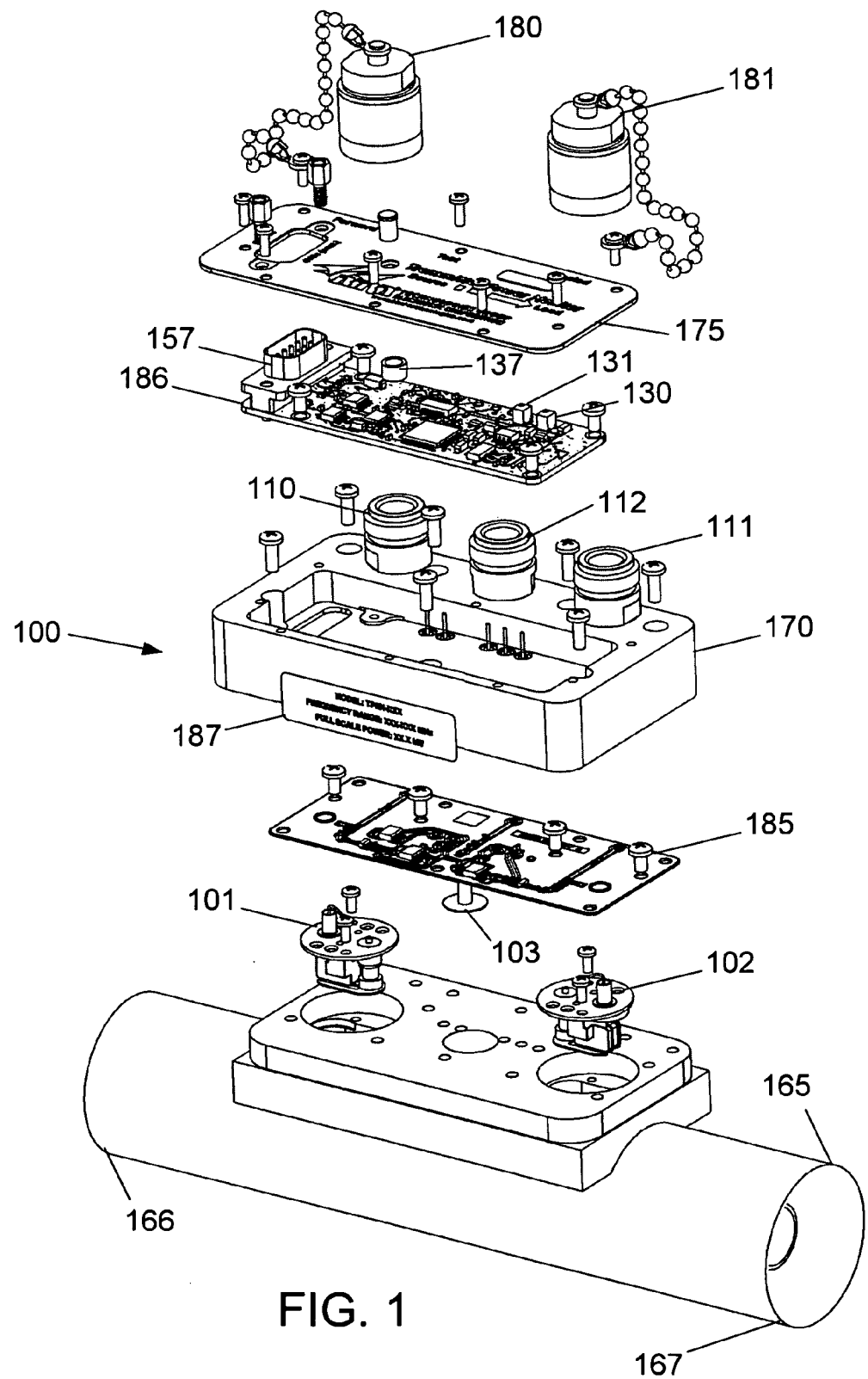
FIG. 1 is an exploded view of an embodiment of the invention.

Referring to FIG. 1, a transmitter power monitor 100 comprises a transmission line section 165 having a transmitter end 166 and a load end 167. A rectangular body 170 is fastened to the top of the transmission line section 165. The body 170 has a cover 175. Forward and reflected directional couplers 101 and 102 and non-directional coupler 103 are located inside the body 170. In the preferred embodiment, non-directional coupler 103 is mounted on a RF board 185, while the RF board 185 is placed on top of forward and reflected couplers 101 and 102. All of the couplers 101, 102, and 103 interface with the RF board.

A logic board 186 is placed on top of and interfaces with the RF board 185. The logic board has a male DE9 9-pin D-sub socket 157, an LED 137, and forward and reflected calibration adjustments 130 and 131. The socket 157 is accessible through the cover 175 and LED 137 is visible through the cover 175. The cover 175 must be removed to gain access to the forward and reflected calibration adjustments 130 and 131. Also, placed on top of and interfacing with the radio frequency board 185 are the forward test port 110, reflected test port 111, and non-directional test port 112. The test ports 110, 111, and 112 are female type "N" connectors. The forward and reflected test ports 110 and 111 are terminated with 2 Watt loads 180 and 181. The test ports 110, 111, and 112 are fastened to the body 170. A sticker 187 containing the calibration data for test ports 110, 111, and 112 is located on the body 170.

Figure 2:
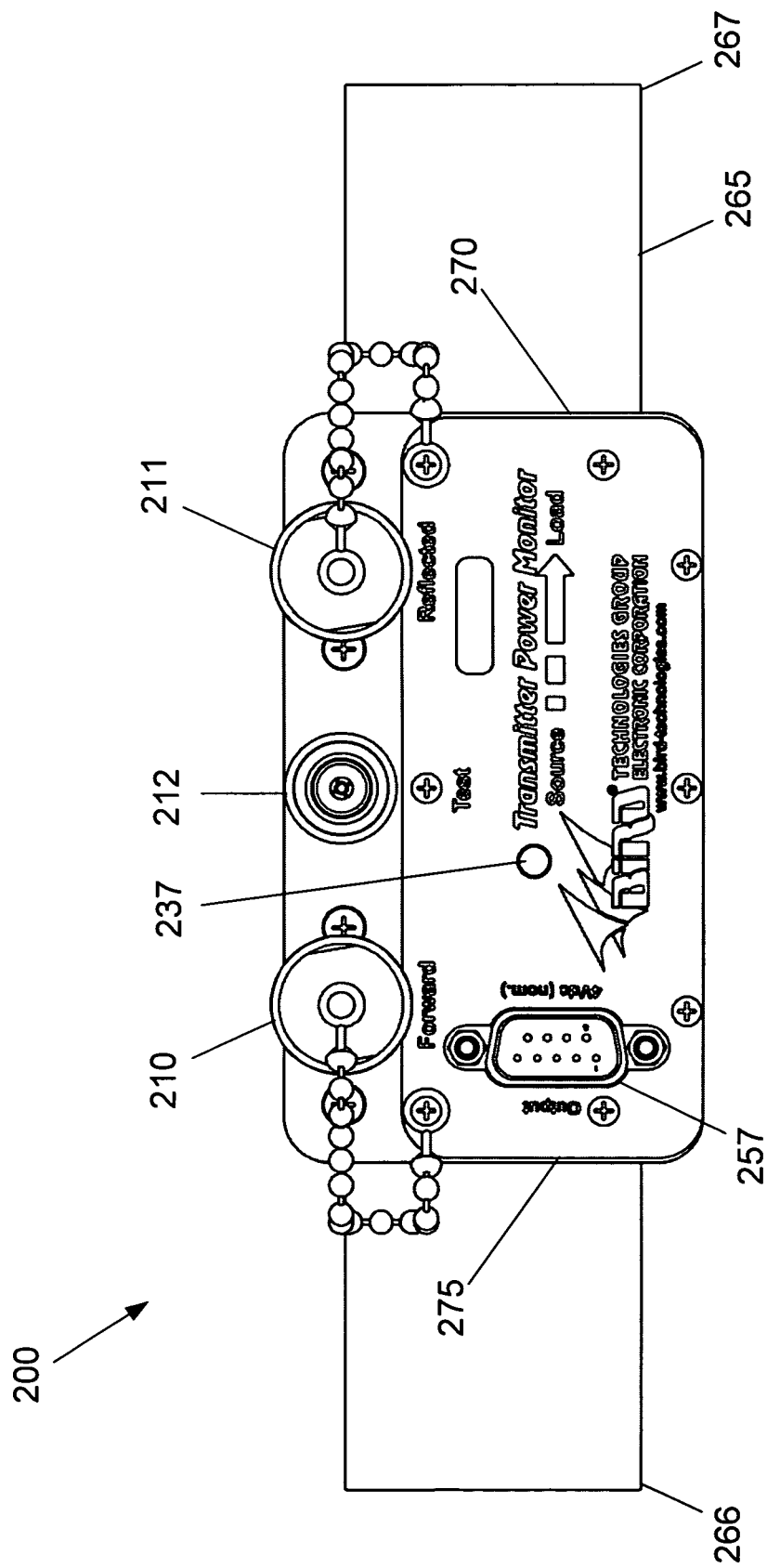
FIG. 2 is a top plan view of the device of FIG. 1.

Referring to the embodiment shown in FIG. 2, a transmitter power monitor 200 comprises a transmission line section 265 with a transmitter end 266 and an antenna end 267. A body 270 is fastened to the top of the transmission line 265. The body 270 has a cover 275. A male DE9 9-pin D-sub socket 257 is accessible through the cover 275 and an LED 237 is visible through the cover 275. A forward test port 210, reflected test port 211, and non-directional test port 212 are fastened to the body 270.

Figure 3:
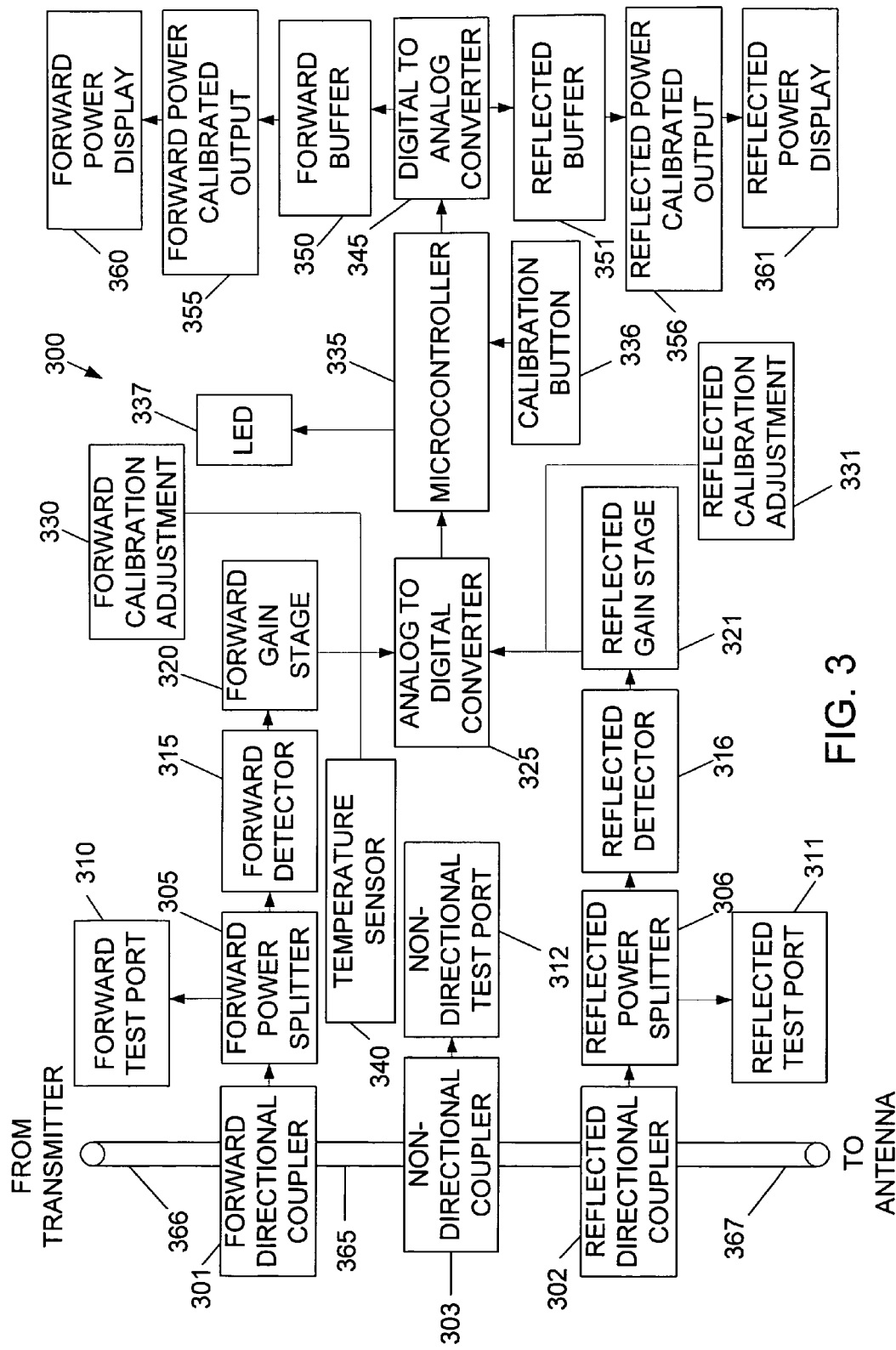
FIG. 3 is a block diagram illustrating the arrangement of the electrical components used in the device of FIGS. 1 and 2.

Referring to the embodiment shown in FIG. 3, radio frequency (RF) voltage samples of the transmission line power are made available by the forward and reflected directional couplers, 301 and 302. In the preferred embodiment, the couplers 301 and 302 are both part number 7006A216 from Bird Technologies Group. The samples of the main transmission line power provided by the couplers 301 and 302 are approximately −55 dB from the main transmission line power. The transmission line 365 has a transmitter end 366 and an antenna end 367. The forward coupler is located at the transmitter end 366 and the reflected coupler is located at the antenna end 367.

The RF voltage samples from the forward directional coupler 301 are routed to the forward power splitter 305, while RF voltage samples from the reflected directional coupler 302 are routed to the reflected power splitter 306. The power splitters 305 and 306 also contain some resistive attenuation for the dual purpose of setting the appropriate voltage levels for the detector circuits 315 and 316, as well as providing isolation between circuit components. In the preferred embodiment, the power splitters 305 and 306 are contained in an RF circuit assembly which is part number 7006A114 from Bird Technologies Group; while the detectors 315 and 316 are each part number SMS7630-005 from Skylink. However, a person having ordinary skill in the art can choose to use other power splitters and detectors as he sees fit.

The forward power splitter 305 outputs a RF voltage to both the forward test port 310 and the forward detector 315. The reflected power splitter 306 outputs a RF voltage to both the reflected test port 311 and the reflected detector 316. The detectors 315 and 316 are square-law diode detectors. A non-directional coupler 303 provides a sample of the main line transmission voltage to a non-directional test port 312. The non-directional coupler 303 is contained in a RF circuit assembly which is part number 7006A114 from Bird Technologies Group. However, a person having ordinary skill in the art can choose to use other non-directional couplers as he sees fit.

During factory calibration, the attenuation relationship in terms of magnitude and frequency response between the main transmission line 365 and each test port 310, 311, and 312, are determined as a function of frequency. This data becomes the test port calibration data. The non-directional test port 312, which is not configured to provide directionality, is typically used for main transmission line 365 energy waveform analyses with spectrum analyzers or modulation analysis tools. In the preferred embodiment, the test ports 310, 311, and 312 are female type "N" connectors, but a person having ordinary skill in the art can choose to use other types of ports as he sees fit.

The forward and reflected detectors 315 and 316 use diodes to convert the RF voltages into small direct current (DC) voltages. The inputs to each of the detectors 315 and 316 are set at a level of approximately −20 dBm maximum, such that the detectors are always operating within the square law region of their dynamic response. The detectors 315 and 316 each provide a DC voltage output of approximately 1 mV.

The output of the forward detector 315 is amplified by a forward gain stage 320 and the output of the reflected detector 316 is amplified by a reflected gain stage 321. The gain stages 320 and 321 are precision operational amplifiers, but a person having ordinary skill in the art can choose to use any operational amplifiers that he sees fit.

In the preferred embodiment, the output of the gain stages 320 and 321 is approximately 2 volts DC at the full scale rating of the instrument. The gain stages 320 and 321 are part number AD8628 from Analog Devices, but a person having ordinary skill in the art can choose to use other operational amplifiers as he sees fit.

Gain stages 320 and 321 output the amplified DC voltage to an analog to digital converter 325. The forward calibration adjustment 330, reflected calibration adjustment 331, and temperature sensor 340 also send signals to the analog to digital converter 325.

In the preferred embodiment the forward calibration adjustment 330 and reflected calibration adjustment 331 preferably produce DC voltages at a level comparable to the output of gain stages 320 and 321, but a person having ordinary skill in the art can choose to use any voltage source and range that he sees fit. The forward calibration adjustment 330 and reflected calibration adjustment 331 each consist of a 5k potentiometer in a voltage divider circuit with a 4.9 k resistor. The analog to digital converter 325 preferably has a resolution of 12 bits, but a person having ordinary skill in the art can use any analog to digital converter having any resolution that he sees fit.

The analog to digital converter 325 digitizes the signals from the forward gain stage output 320, reflected gain stage output 321, forward calibration adjustment 330, reflected calibration adjustment 331, and temperature sensor 340 and sends the digital signals to the microcontroller 335. The temperature sensor 340 is located in close proximity to the detectors 315 and 316. The output of detectors 315 and 316 varies with the ambient air temperature. The microcontroller 335 uses the digitized temperature sensor 340 output in conjunction with the temperature characterization curve of the detectors 315 and 316 stored in microcontroller 335 to compensate for the effects of thermally induced drift in the forward and reflected detectors 315 and 316. In the preferred embodiment, the temperature sensor is a TMP36 from Analog Devices.

The microcontroller 335 also receives the output of the calibration button 336. The power monitor 300 is capable of calculating and compensating for any offsets introduced by circuitry in the forward and reflected channel signal paths located between the transmission line 365 and up to and including microcontroller 335. This helps to ensure that the forward and reflected channels of power monitor 300 will output a power level substantially equal to zero, when zero power is travelling through the transmission line 365. In the preferred embodiment, this process compensates for offsets introduced by the forward and reflected directional couplers 301 and 302, forward and reflected power splitters 305 and 306, forward and reflected detectors 315 and 316, forward and reflected gain stages 320 and 321, analog to digital converter 325, microcontroller 335, and any other circuitry between transmission line 365 and microcontroller 335.

In the preferred embodiment, the circuitry is zero power calibrated or "zeroed" by pressing and holding the calibration button 336 for a specific amount of time with zero power in the transmission line 365, during which time the LED 337 will blink. After the calibration button 336 is released, the forward and reflected channel zero power offsets are calculated and the zero power offset compensation is applied. Normally, this process would be done either during a factory calibration or in the field when a customer is performing calibration while the power monitor 300 is installed.

The microcontroller 335 provides an output to the LED 337, which provides a visual indication of the zero power offset calibration status. In the preferred embodiment, the LED 337 states are as follows: the LED 337 turns off in when the power monitor 300 is being "zeroed"; LED 337 turns and remains on when the power monitor 300 is "zeroed"; and LED 337 blinks if the power monitor 300 is not "zeroed" and is not being "zeroed".

The main task of the microcontroller 335 is to provide some digital averaging of the data received from the analog to digital converter 325, provide a means to perform temperature correction, provide a means to perform zero offset power correction, and apply the forward and reflected channel gain ratio correction dictated by the forward and reflected calibration adjustments 330 and 331. The microcontroller correlates the voltage output of the forward and reflected calibration adjustments 330 and 331 to an overall circuit gain ratio correction setting established in the microcontroller firmware and applies the appropriate gain ratio correction to each respective channel.

The microcontroller 335 applies the temperature correction, zero power offset correction, and circuit gain ratio correction to the digital forward and reflected channel signals, and outputs the corrected digital forward and reflected channel signals to a digital to analog converter 345, which converts the corrected digital signals to analog DC voltages. The output of the digital to analog converter 345 is adjustable, thereby allowing the entire system to be calibrated using a high power reference. The digital to analog converter 345 sends the respective forward and reflected corrected DC voltages to a forward buffer 350 and reflected buffer 351. The buffers 350 and 351 are precision gain stages, which ensure that a low source impedance is possible with the instrument, thereby minimizing the potential for electrical noise. The gain stages used in the preferred embodiment are precision operation amplifiers, but a person having ordinary skill in the art can use any precision gain stage that he sees fit.

The corrected DC voltage output of the forward buffer 350 is then sent to the forward power calibrated output 355 and the corrected DC voltage output of the reflected buffer 351 is sent to the reflected power calibrated output 356. In the preferred embodiment, the calibrated outputs 355 and 356 are pins in a male DE9 9-pin D-sub socket on the body of the transmitter power monitor, but a person having ordinary skill in the art can use any output method that he sees fit. In the preferred embodiment, the transmitter power monitor provides 0-4 VDC at the calibrated outputs 355 and 356. These voltages are linearly proportional to the main transmission line power in that if a particular transmitter power monitor has a 10 kW full scale power range at 4.0V, an output of 2.0V would correspond to 5 kW. Although the calibrated outputs 355 and 356 have a linear 0-4V DC output, it is contemplated that a person having ordinary skill in the art can use any output scale and range that he sees fit.

A user can then monitor the forward and reflective power levels by connecting a forward power display 360 to the forward power calibrated output 355 and a reflected power display 361 to the reflected power calibrated output 356. The forward and reflected power displays 360 and 361 are capable of displaying the full scale power equivalent of the corrected DC voltage. Possible types of power displays 360 and 361 include analog meters or a computer system, but a person having ordinary skill in the art can use any display method that he sees fit.

Further, in addition to "zeroing" the power monitor, a user can calibrate the individual forward and reflected power measurements by applying a gain ratio correction to the channels, under actual operating conditions, and at the exact power level and frequency where the power monitor 300 is used, thereby minimizing errors associated with the directional coupler frequency response and detector linearity.

In one embodiment, the power monitor forward measurement is in-line calibrated by connecting a reference power meter to the forward test port 310 to measure the forward power on transmission line 365, the attenuation data between the transmission line 365 and the forward test port 310 is inputted into the reference power meter, and the forward calibration adjustment 330 is appropriately manipulated until the output of the forward power channel correctly corresponds to the forward power on transmission line 365. In the preferred embodiment, the output of the forward power channel is ascertained through the use of a forward power display 360 connected to the forward power calibrated output 355.

Stated alternatively, to calibrate the forward power measurement, an accurate reference power meter is connected to the forward test port 310, the forward test port 310 attenuation data is then entered into the reference power meter to establish the correct attenuation relationship between forward test port 310 and transmission line 365. Upon entering the attenuation data, the reference power meter reading is equivalent to the forward power on the transmission line 365. The calibration process is completed by adjusting the transmitter power monitor forward calibration adjustment 330 accordingly so that the forward power display 360 reading is substantially equivalent to the reference power meter reading. The forward power display 360 reading is substantially equivalent to the reference power meter reading when the forward power display 360 reading is within ±1% of the reference power meter reading. Preferably, the forward calibration adjustment 330 is adjusted until the forward power display 360 reading is equal to the reference power meter reading.

In one embodiment, the power monitor reflected measurement is in-line calibrated by connecting a reference power meter to the reflected test port 311 to measure the reflected power on transmission line 365, the attenuation data between the transmission line 365 and the reflected test port 311 is inputted into the reference power meter, and the reflected calibration adjustment 331 is appropriately manipulated until the output of the reflected power channel correctly corresponds to the reflected power on transmission line 365. In the preferred embodiment, the output of the reflected power channel is ascertained through the use of a reflected power display 361 connected to the reflected power calibrated output 356.

Stated alternatively, to calibrate the reflected power measurement, an accurate reference power meter is connected to the reflected test port 311, the reflected test port 311 attenuation data is then entered into the reference power meter to establish the correct attenuation relationship between reflected test port 311 and transmission line 365. Upon entering the attenuation data, the reference power meter reading is equivalent to the reflected power on the transmission line 365. The calibration process is completed by adjusting the transmitter power monitor reflected calibration adjustment 331 accordingly so that the reflected power display 361 reading is substantially equivalent to the reference power meter reading. The reflected power display 361 reading is substantially equivalent to the reference power meter reading when the reflected power display 361 reading is within ±1% of the reference power meter reading. Preferably, the reflected calibration adjustment 331 is adjusted until the reflected power display 361 reading is equal to the reference power meter reading.

Further, in other embodiments, it is contemplated that a user can calibrate the output of the forward and reflected channels by correcting the gain ratio of the forward and reflected channels through manipulating the gains and attenuation of the individual circuit components comprising the forward and reflected channel signal paths. The circuitry components include gain stages 320 and 321 and buffers 350 and 351. When manipulating the gains and attenuation, one should be mindful to keep the operation of detectors 315 and 316 within the square-law region. In the preferred embodiment, the forward and reflected channel gain ratio is 10:1.

Further, in other embodiments, it is contemplated that a user can replace microcontroller 335 with a suitable microprocessor, application specific integrated circuit, field programmable gate array, or discrete circuitry. It is also contemplated that the functions of the forward and reflected gain stages 320 and 321, analog to digital converter 325, digital to analog converter 345, and forward and reflected buffers 350 and 351 could be performed on-board microcontroller 335.

Figure 4:
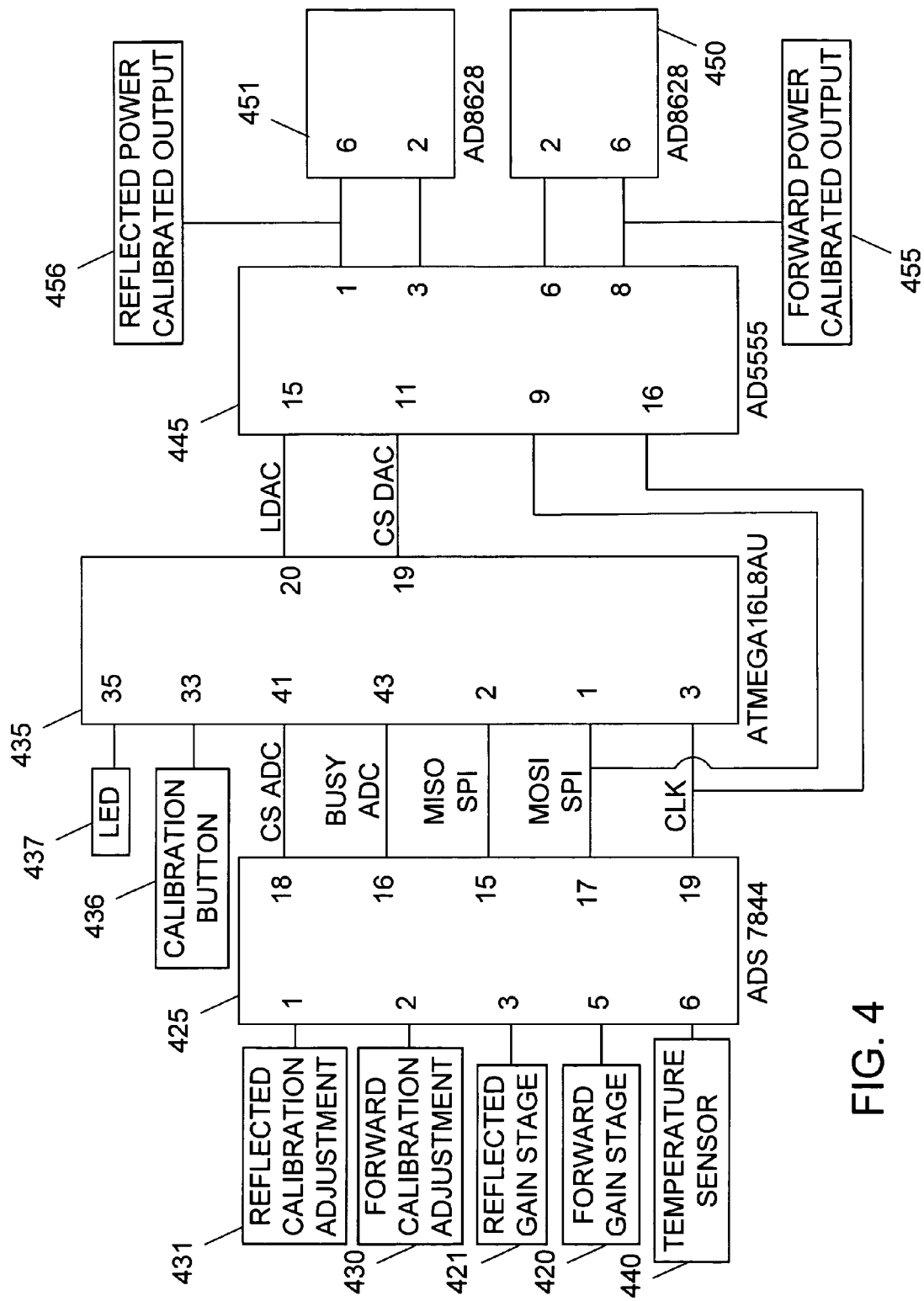
FIG. 4 is an interconnection diagram of some components depicted in FIGS. 1, 2 and 3.
Figure 5A:
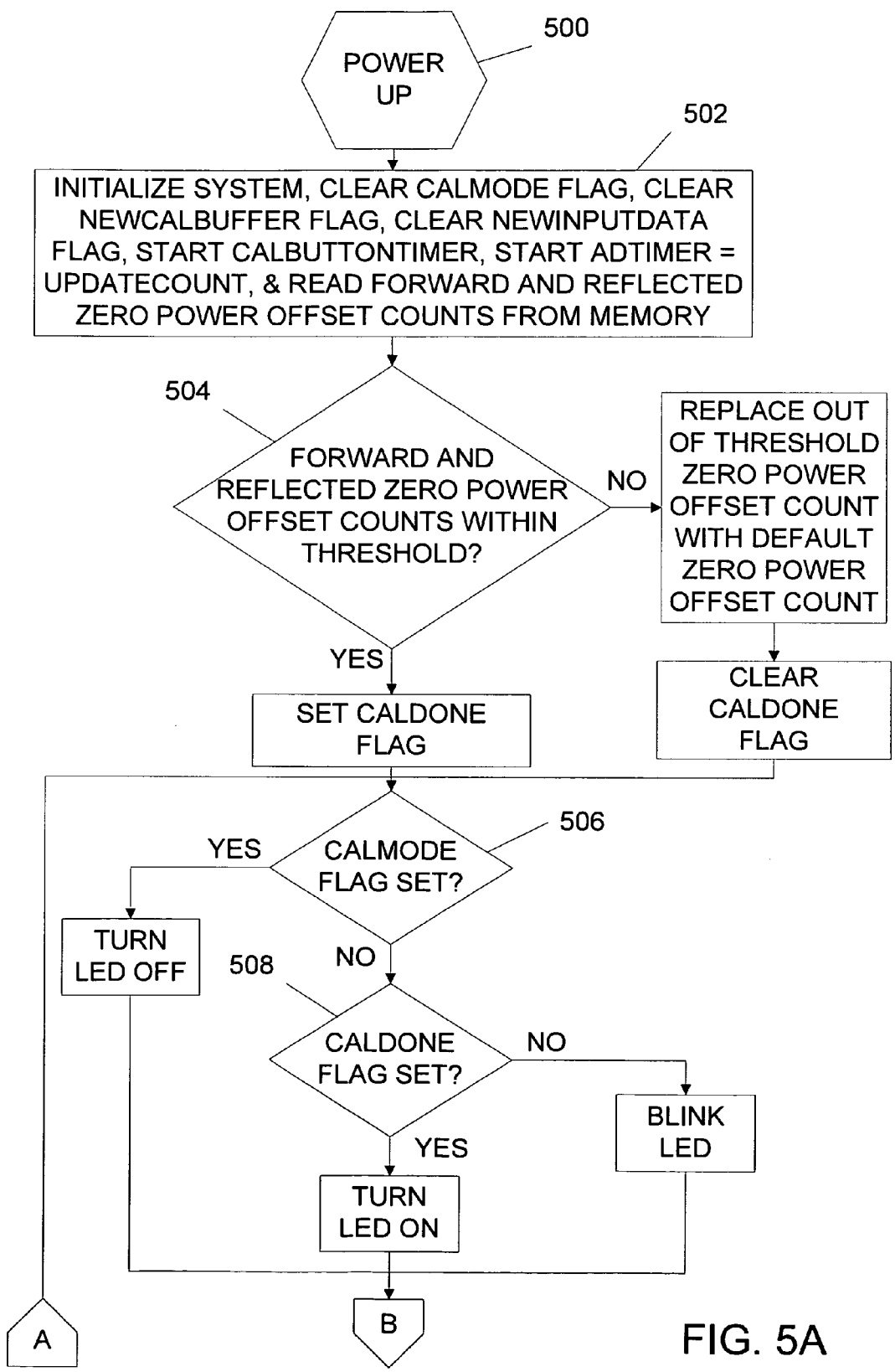
FIG. 5A-H is a flowchart of the firmware contained in the microcontroller of FIGS. 1, 2, 3 and 4.
Figure 5B:
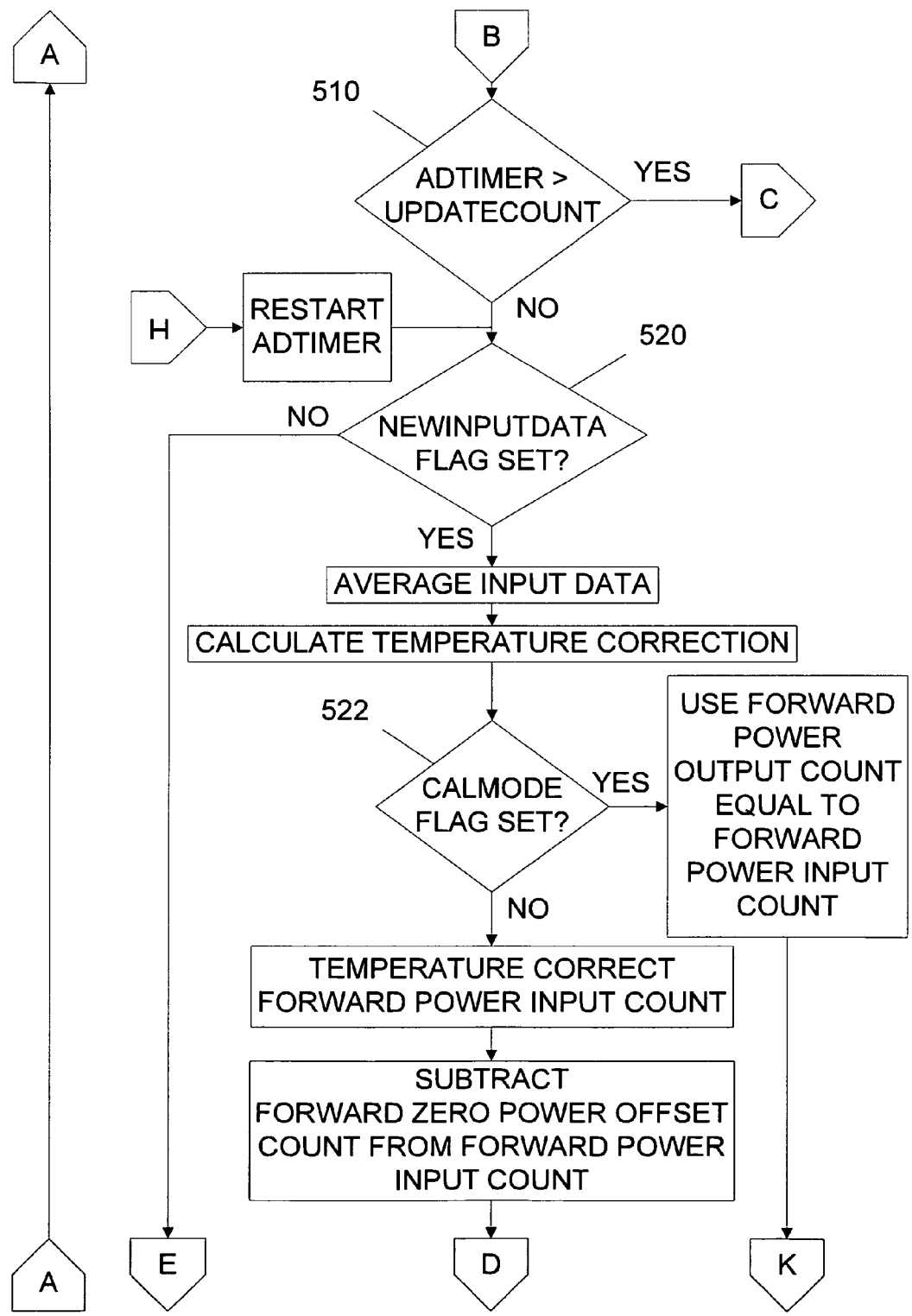
Figure 5C:
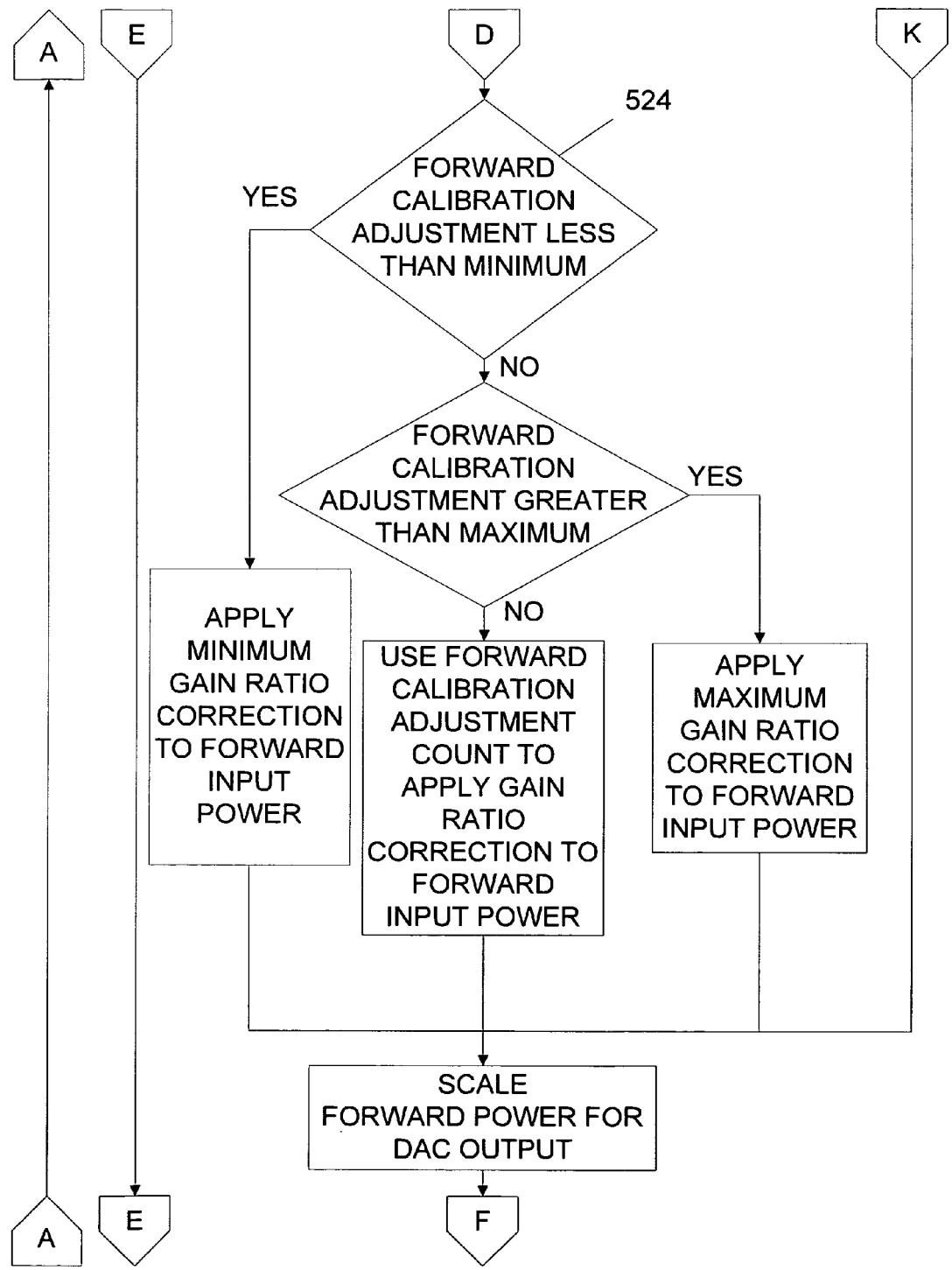
Figure 5D:
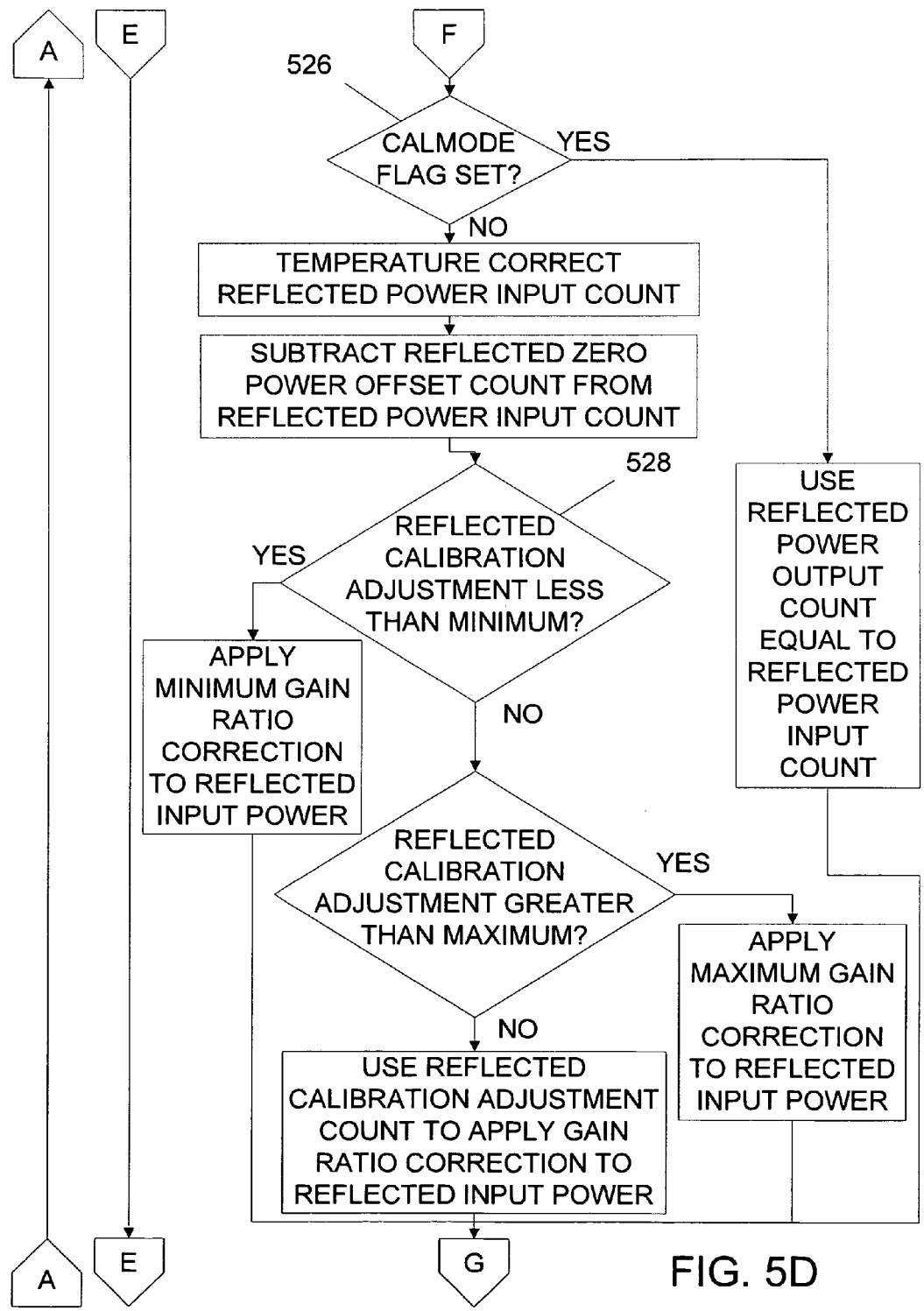
Figure 5E:
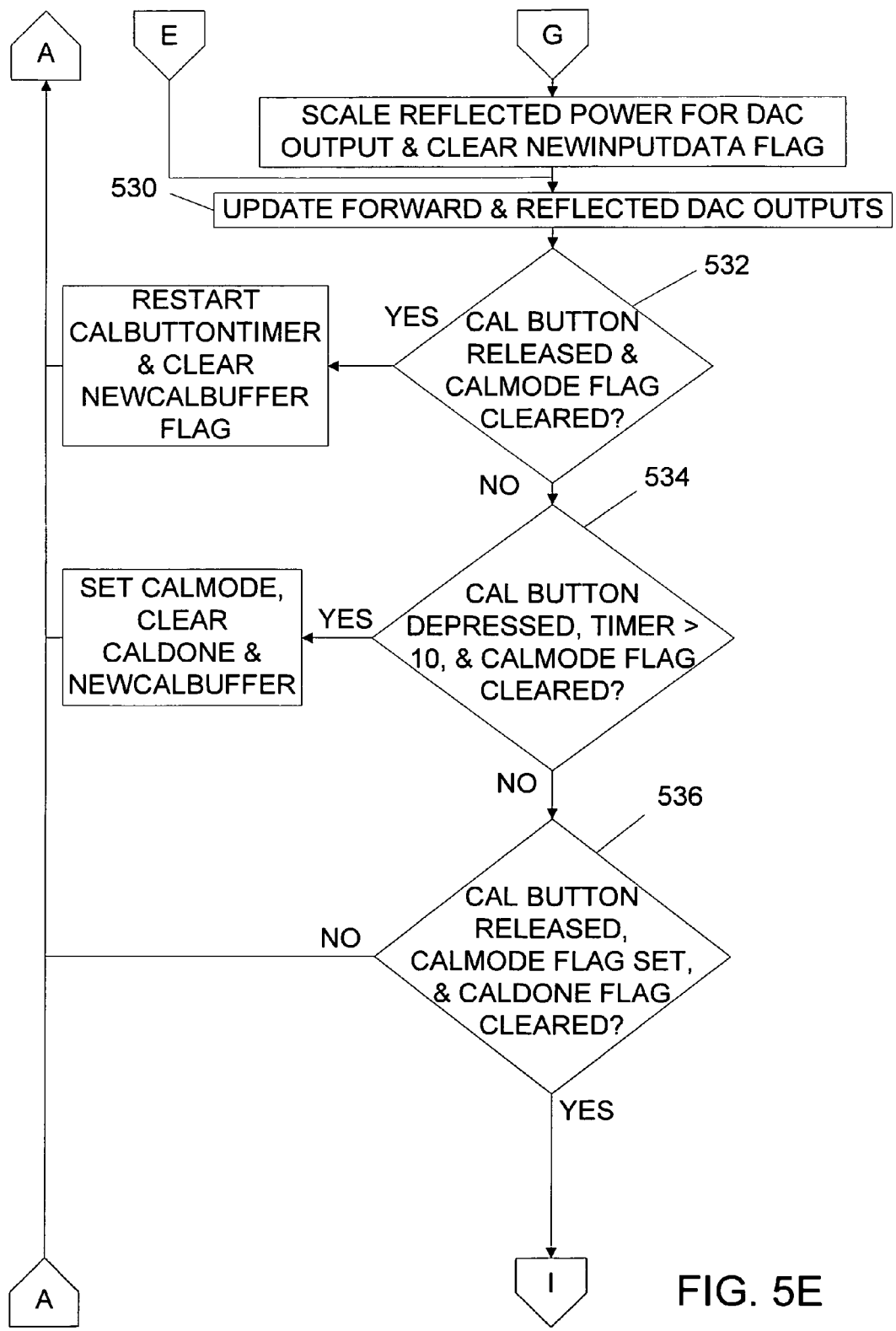
Figure 5F:
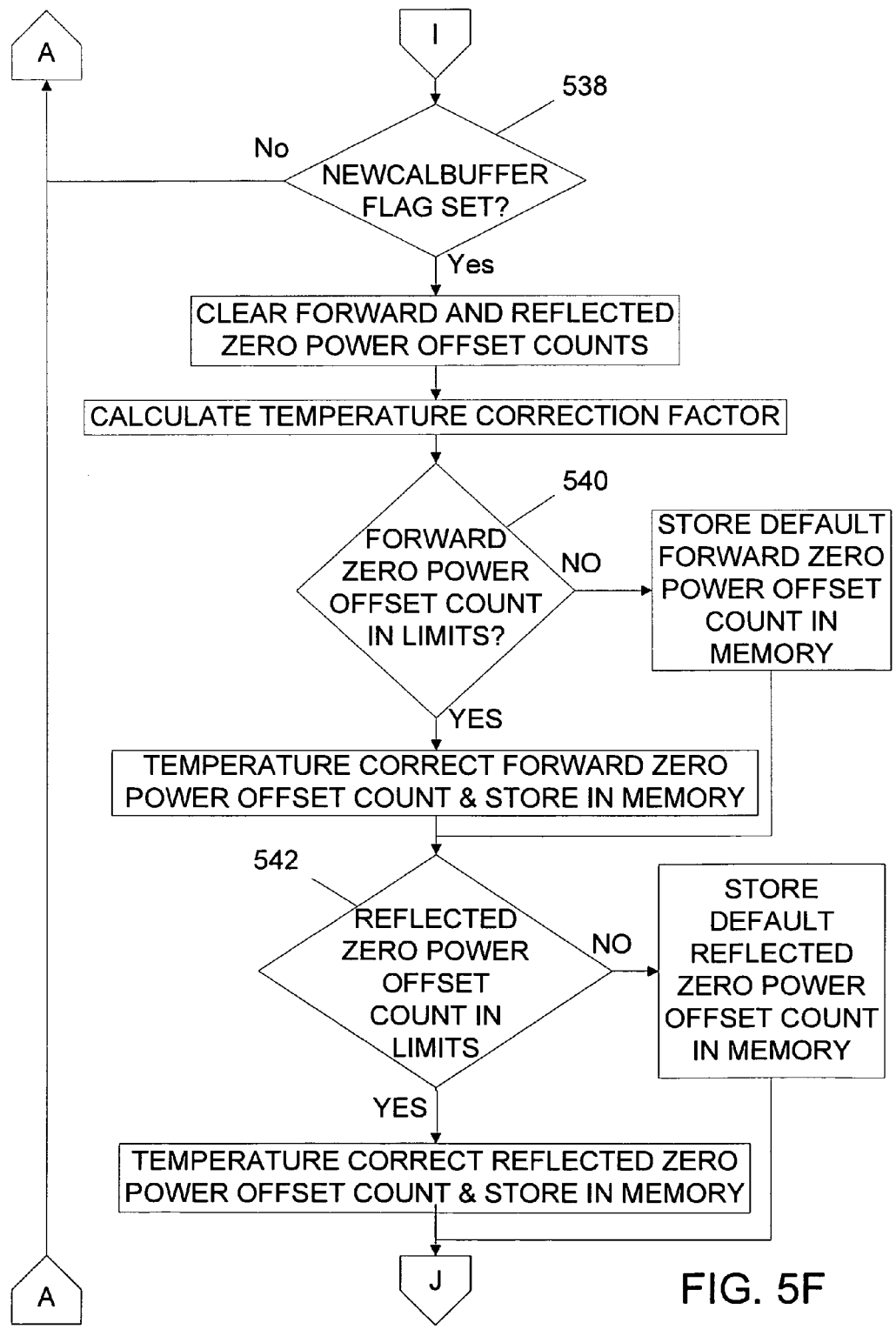
Figure 5G:
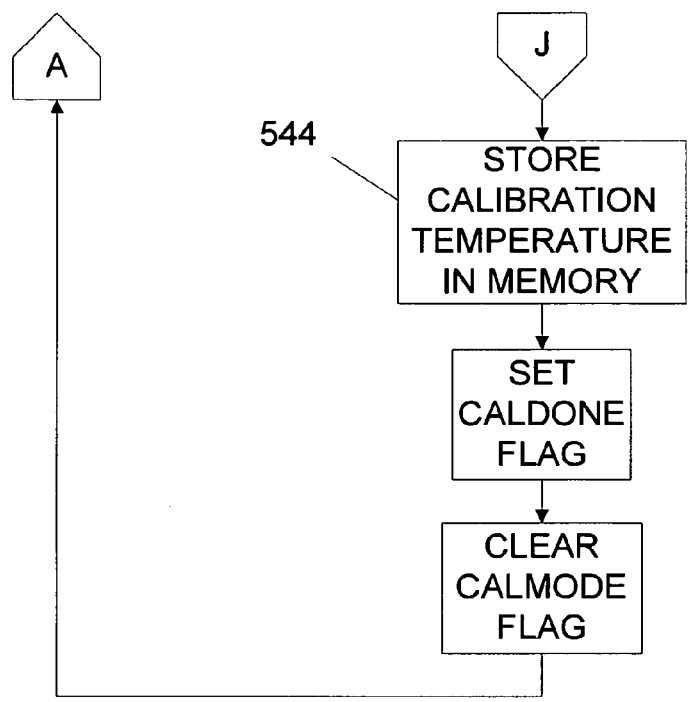
Figure 5H:
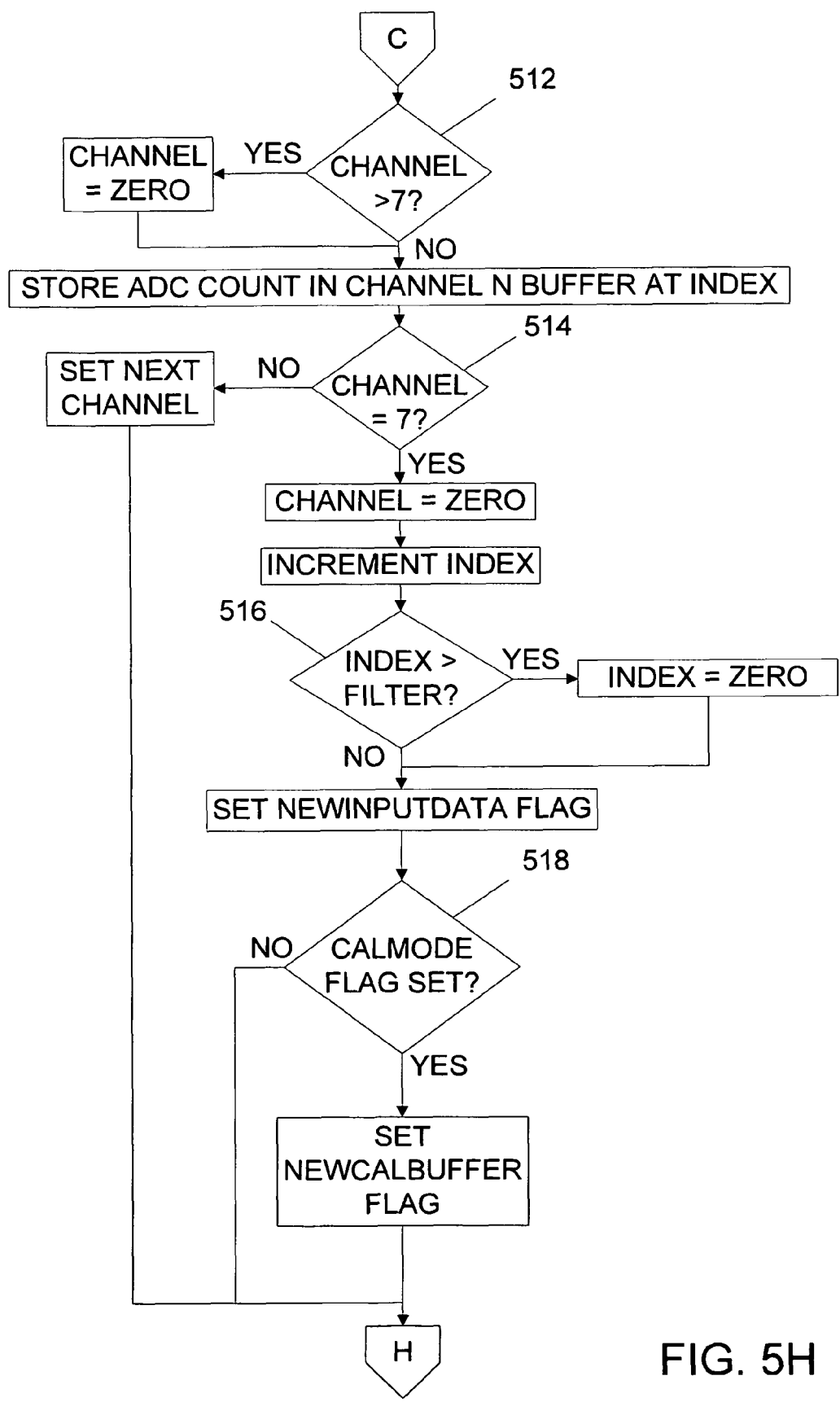

Referring to the embodiment shown in FIG. 4, an interconnection diagram is shown which conveys the pin connections of the analog to digital converter 425, microcontroller 435, digital to analog converter 445, reflected buffer 451, and forward buffer 450. For simplicity, the power connections, ground connections, capacitors, resistors, and other components are not shown.

The analog to digital converter 425 receives an input from the reflected calibration adjustment 431 on pin 1, the forward calibration adjustment 430 on pin 2, the reflected gain stage 421 on pin 3, the forward gain stage 420 on pin 5, the temperature sensor 440 on pin 6, and the clock 426 on pin 19. In the preferred embodiment, the analog to digital converter is Texas Instrument part number ADS 7844, but a person having ordinary skill in the art can use any analog to digital converter that he sees fit.

The microcontroller 435 receives an input from the calibration button 436 on pin 33, outputs a clock pulse on pin 3 and outputs a signal to the LED 437 from pin 35. As can be seen in FIG. 4, pins 18, 16, 17, 15, and 19 of the analog to digital converter 425 interface with pins 41, 43, 1, 2, and 3 of the microcontroller 435. In the preferred embodiment, the microcontroller is an ATMEGA16L8AU from Amtel.

Turning to the digital to analog converter 445, as can be seen from FIG. 4, pins 1, 3, 19, and 20 of the microcontroller 435 interface with pins 9, 16, 11, and 15 of the digital to analog converter 445. In the preferred embodiment, the digital to analog converter 445 is Analog Devices part number AD5555, but a person having ordinary skill in the art can use any digital to analog converter that he sees fit.

Turning to the reflected and forward buffers 451 and 450, pins 6 and 2 of the reflected buffer 451 interface with pins 1 and 3 of the digital to analog converter 445. Meanwhile, pins 2 and 6 of the forward buffer 450 interface with pins 6 and 8 of the digital to analog converter 445. In the preferred embodiment, both the reflected buffer 451 and forward buffer 450 are Analog Devices part number AD8628, which were selected for their low offset voltage and drift, but a person having ordinary skill in the art can use any operational amplifier that he sees fit.

The digital to analog converter 445 and buffers 451 and 450 are configured for positive voltage output. The reflected calibrated power output 456 is taken from pin 6 of the reflected buffer 451; while the forward calibrated power output 455 is taken from pin 6 of the forward buffer 450. In the preferred embodiment, buffers 451 and 450 are configured for unity gain, but a person having ordinary skill in the art can use any configuration that he sees fit.

Referring to FIG. 5 A-H, some components are referred to with reference to FIG. 3. FIG. 5 A-H is a flowchart of the firmware contained in the microcontroller 335. In stages 500 and 502, the microcontroller 335 is powered up, the variables are initialized, the calMode, newCalBuffer, and newInputData flags are cleared, the calButtonTimer is started at 0, the adTimer is started at UPDATECOUNT, and the forward and reflected zero power offset counts are retrieved from the memory. In the preferred embodiment, UPDATECOUNT=3.

In stage 504, the program verifies that the forward and reflected zero power offset counts are within the limits specified in the program. If one of the zero power offset counts is not within the specified limit, the default zero power offset count is loaded for the zero power offset count and the calDone flag is cleared. The program progresses to stage 506 after both of the zero power offset counts are verified. If the zero power offset counts are within the specified limits, the calDone flag is set and the program progresses to stage 506. In the preferred embodiment, a forward or reflected power offset count is not within the specified limit if both of the following do not occur, the zero power offset count is less than or equal to MAXZEROOUT and is greater than 0. Further, the default zero power offset count is 0 in the preferred embodiment.

In stage 506 the program considers the status of the calMode flag. If the calMode flag is set, the program will turn off the LED 337 and progress to stage 510. If the calMode flag is not set, the program progresses to stage 508. In stage 508, the program blinks LED 337 if the calDone flag is not set, but turns on LED 337 if the calDone flag is set. Following stage 508, in stage 510, the program considers the adTimer status. If the adTimer is less than or equal to UPDATECOUNT, the program progresses to stage 520. However, the program progresses to stage 512 if the adTimer is greater than UPDATECOUNT.

Stages 512 through 518 use the information received from the analog to digital converter 325 to create input data. The input data consists of a series of arrays, one for each type of data sent from the analog to digital converter 325. The analog to digital converter 325 sends converted data to the microcontroller 335 from the forward calibration adjustment 330, forward gain stage 320, temperature sensor 340, reflected gain stage 321, and reflected calibration adjustment 331. The number of elements in each array is equal to the filter value. In the preferred embodiment, the filter value is 16, but a person having ordinary skill in the art can use any number of elements that he sees fit.

In stage 512, if the analog to digital channel is greater than 7, the channel n is set to 0 and the information received from the analog to digital converter is stored in the current channel n buffer at the current index value of the array. If the analog to digital channel is not greater than 7, the program stores the information received from the analog to digital converter in the channel n buffer at the current index value of the array. In the next stage, 514, if the analog to digital channel is not equal to 7, the program increments the channel and progresses to stage 520. If the analog to digital channel is equal to 7, the channel is set to 0, the index is incremented and the program moves to stage 516. In stage 516, if the index is greater than the filter, the program sets the index equal to 0 and sets the newInputData flag, thereby acknowledging that the input data update is ready, and progresses to stage 518. If the index is not greater than the filter, the program sets the newInputData flag, thereby acknowledging that the input data update is ready, and progresses to stage 518.

In stage 518, the program examines the calMode flag. If the calMode flag is not set, the adTimer is restarted at 0 and the program progresses to stage 520. However, if the calMode flag is set, the newCalBuffer flag is set, the adTimer is restarted at 0, and the program progresses to stage 520. Once in stage 520, if the newInputData flag is cleared, an input data update from the analog to digital converter 325 is not available, and the program progresses to stage 530. If the newInputData flag is set, an input data update is available, the input data is averaged, and the temperature correction is calculated based on the temperature sensor 340 input. The temperature correction formula in the preferred embodiment is as follows: $(4.106e\text{-}07*(\text{temperature sensor input value})^2)+(-4.952e\text{-}04*\text{temperature sensor input value})+0.9830$. After calculating the temperature correction, the program advances to stage 522.

In stage 522, if the calMode flag is set, the forward power output count is set equal to the forward power input count and scaled for output to the digital to analog converter 345. The forward power input count is equal to the average input value from the forward gain stage 320. In the preferred embodiment, the forward power output count sent to the digital to analog converter 345 is equal to (forward power input count)*(ADSCALE), with ADSCALE=4.

If the calMode flag is not set, the forward power input count is temperature corrected by multiplying the forward power input count by the temperature correction formula. The forward power input count is equal to the averaged input values from the forward gain stage 320. The forward power input count is then "zero corrected" by subtracting the forward zero power offset count from the forward power input count before progressing to stage 524.

In stage 524, if the average input from the forward calibration adjustment 330 is less than the predefined minimum threshold, the minimum forward gain ratio correction is applied to the forward power input count and the forward power input count is scaled for output to the digital to analog converter 345. In the preferred embodiment, the predetermined minimum threshold is 2080 and the forward power output count sent to the digital to analog converter 345 is equal to (forward power input count)*(POTMINSCALE)*(ADSCALE), with POTMINSCALE=1.0 and ADSCALE=4. The ADSCALE value is used to scale the forward power input count for output to the digital to analog converter 345. Gain ratio correction is provided through the POTMINSCALE value.

However, if the average input from the forward calibration adjustment 330 exceeds the predefined maximum threshold, the maximum forward gain ratio correction is applied the forward power input count and the forward power output count is scaled for output to the digital to analog converter 345. In the preferred embodiment, the predetermined maximum threshold is 3680 and the forward power count outputted to the digital to analog converter 345 is equal to (forward power input count)*(POTMAXSCALE)*(ADSCALE), with POTMAXSCALE=2.0 and ADSCALE=4. The ADSCALE value is used to scale the forward power input count for output to the digital to analog converter. Gain ratio correction is provided through the POTMAXSCALE value.

However, if the average input from the forward calibration adjustment 330 is between the minimum and maximum thresholds, the average input from the forward calibration adjustment 330 is used to apply the gain ratio correction to the forward power input count. The forward power input count is also scaled for output to the digital to analog converter 345. In the preferred embodiment, the forward power count outputted to the digital to analog converter 345 is equal to ((forward power input count)*((average input from the forward calibration adjustment)/(POTSCALE))−(POTCONSTANT))*(ADSCALE), with POTSCALE=1600, POTCONSTANT=0.3, and ADSCALE=4. The ADSCALE value is used to scale the forward power input count for output to the digital to analog converter. Gain ratio correction is provided through ((average input from the forward calibration adjustment)/(POTSCALE))−(POTCONSTANT).

After applying the gain correction ratio to the forward power input count and scaling the forward power input count for to the digital to analog converter, the program moves to stage 526.

In stage 526, if the calMode flag is set, the reflected power output count is set equal to the reflected power input count and scaled for output to the digital to analog converter 345. The reflected power input count is equal to the average input value from the reflected gain stage 321. In the preferred embodiment, the reflected power output count sent to the digital to analog converter 345 is equal to (reflected power input count)*(ADSCALE), with ADSCALE=4.

If the calMode flag is not set, the reflected power input count is temperature corrected by multiplying the reflected power input count by the temperature correction formula. The reflected power input count is equal to the averaged input values from the reflected gain stage 321. The reflected power input count is then "zero corrected" by subtracting the reflected zero power offset count from the reflected power input count before progressing to stage 528.

In stage 528, if the average input from the reflected calibration adjustment 331 is less than the predefined minimum threshold, the minimum reflected gain ratio correction is applied to the reflected power input count and the reflected power input count is scaled for output to the digital to analog converter 345. In the preferred embodiment, the predetermined minimum threshold is 2080 and the reflected power output count sent to the digital to analog converter 345 is equal to (reflected power input count)*(POTMINSCALE)*(ADSCALE), with POTMINSCALE=1.0 and ADSCALE=4. The ADSCALE value is used to scale the reflected power input count for output to the digital to analog converter. Gain ratio correction is provided through the POTMINSCALE value.

However, if the average input from the reflected calibration adjustment 331 exceeds the predefined maximum threshold, the maximum reflected gain ratio correction is applied to the reflected power input count and the reflected power input count is scaled for output to the digital to analog converter 345. In the preferred embodiment, the predetermined maximum threshold is 3680 and the reflected power count outputted to the digital to analog converter 345 is equal to (reflected power input count)*(POTMAXSCALE)*(ADSCALE), with POTMAXSCALE=2.0 and ADSCALE=4. The ADSCALE value is used to scale the reflected power input count for output to the digital to analog converter. Gain ratio correction is provided through the POTMAXSCALE value.

However, if the average input from the reflected calibration adjustment 331 is between the minimum and maximum thresholds, the average input from the reflected calibration adjustment 331 is used to scale the reflected power input count for output to the digital to analog converter 345. In the preferred embodiment, the reflected power count outputted to the digital to analog converter 345 is equal to ((reflected power input count)*((average input from the reflected calibration adjustment)/(POTSCALE))−(POTCONSTANT))*(ADSCALE), with POTSCALE=1600, POTCONSTANT=0.3, and ADSCALE=4. The ADSCALE value is used to scale the reflected power input count for output to the digital to analog converter. Gain ratio correction is provided through ((average input from the reflected calibration adjustment)/(POTSCALE))−(POTCONSTANT).

After scaling the reflected power count for output, the newInputdata flag is cleared and the program moves to stage 530.

In stage 530, the forward and reflected power output counts are sent to the digital to analog converter 345. If a forward or reflected power output count is negative, the negative count is replaced with a 0 before the count is outputted to the digital to analog converter 345. If a forward or reflected power output count is greater than a threshold level, the count exceeding the threshold level is replaced with a default count before the count is outputted to the digital to analog converter 345. In the preferred embodiment, any count that exceeds 16383 is replaced with a default count of 16383. The analog forward and reflected power output counts are then sent from the digital to analog converter 345 to the forward buffer 350 and reflected buffer 351.

Following stage 530, the program investigates whether the calibration button 336 is depressed in stage 532. If the calibration button 336 is not depressed and the calMode flag is cleared, the program restarts the calButtonTimer at 0, clears the newCalBuffer flag, and moves to stage 506. However, if the calibration button 336 is depressed or the calMode flag is set, the program moves to stage 534.

In stage 534, the program examines the calibration button 336, timer, and calMode flag status. If the calibration button 336 is depressed, the timer is greater than 10, and the calMode flag is cleared, the program sets the calMode flag and clears the both calDone and newCalBuffer flags before moving to stage 506. If the calibration button 336 is released, the timer is less than 10, or the calMode flag is set, the program moves to stage 536. In the preferred embodiment, the microcontroller 335 senses the calibration button as depressed whenever pin 33 of microcontroller 335 is pulled low. Pin 33 of microcontroller 335 is connected to pin 9 of the male DE9 9-pin D-sub socket.

In stage 536, if the calibration button 336 is depressed, the calMode flag is cleared, or the calDone flag is set, the program progresses to stage 506. However, if the calibration button 336 is released, the calMode flag is set, and the calDone flag is cleared, the program progresses to stage 538. Once at stage 538, if the newCalBuffer flag is not set, the program progresses to stage 506. However, if the newCalBuffer flag is set, the forward and reflected zero power offset count memory is cleared, the temperature correction factor is calculated, and the program progresses to stage 540.

In stage 540, if the forward zero power offset count is within a predetermined threshold, the temperature correction factor is applied to the forward zero power offset count, the temperature corrected forward zero power offset count is stored in the memory, and the program progresses to stage 542. The forward zero power offset count is the average input value received from forward gain stage 320.

However, if the forward zero power offset count is not within a predetermined threshold, the default forward zero power offset count is stored in the memory and the program progresses to stage 542. In the preferred embodiment, the forward zero power offset count is within the predetermined limits if it is greater than 0 and less than or equal to MAXZEROOUT, with MAXZEROOUT=200. Further, in the preferred embodiment, the default forward zero power offset count is 0.

In stage 542, if the reflected zero power offset count is within a predetermined threshold, the temperature correction factor is applied to the reflected zero power offset count, the temperature corrected reflected zero power offset count is stored in the memory, and the program progresses to stage 544. The reflected zero power offset count is the average input value received from reflected gain stage 321.

However, if the reflected zero power offset count is not within a predetermined threshold, the default reflected zero power offset count is stored in the memory and the program progresses to stage 544. In the preferred embodiment, the reflected zero power offset count is within the predetermined limits if it is greater than 0 and less than or equal to MAXZEROOUT, with MAXZEROOUT=200. Further, in the preferred embodiment, the default reflected zero power offset count is 0.

In stage 544, the calibration temperature is stored in the memory, the calDone flag is set, and the calMode flag is cleared before progressing to stage 506.

The default values, threshold or limit values, formulas, and program structure discussed above in conjunction with the flow chart of FIG. 5 are representative of those found in the preferred embodiment. However, it is contemplated that a person having ordinary skill in the art may use any values, formulas, or program structure that he sees fit.

Figure 6A:
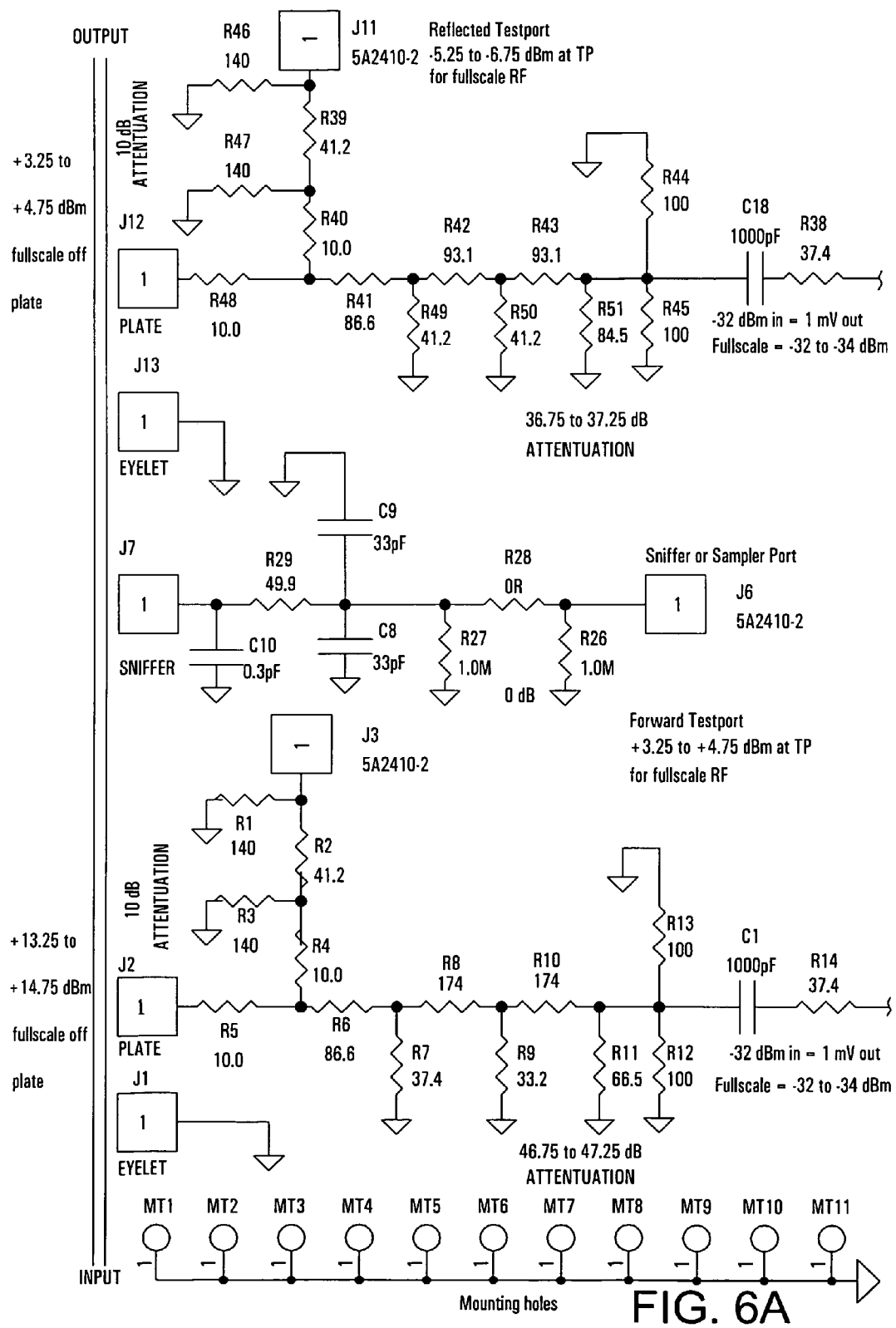
FIG. 6A-H are electrical schematics of the device in FIGS. 1, 2, 3, 4, and 5.
Figure 6B:
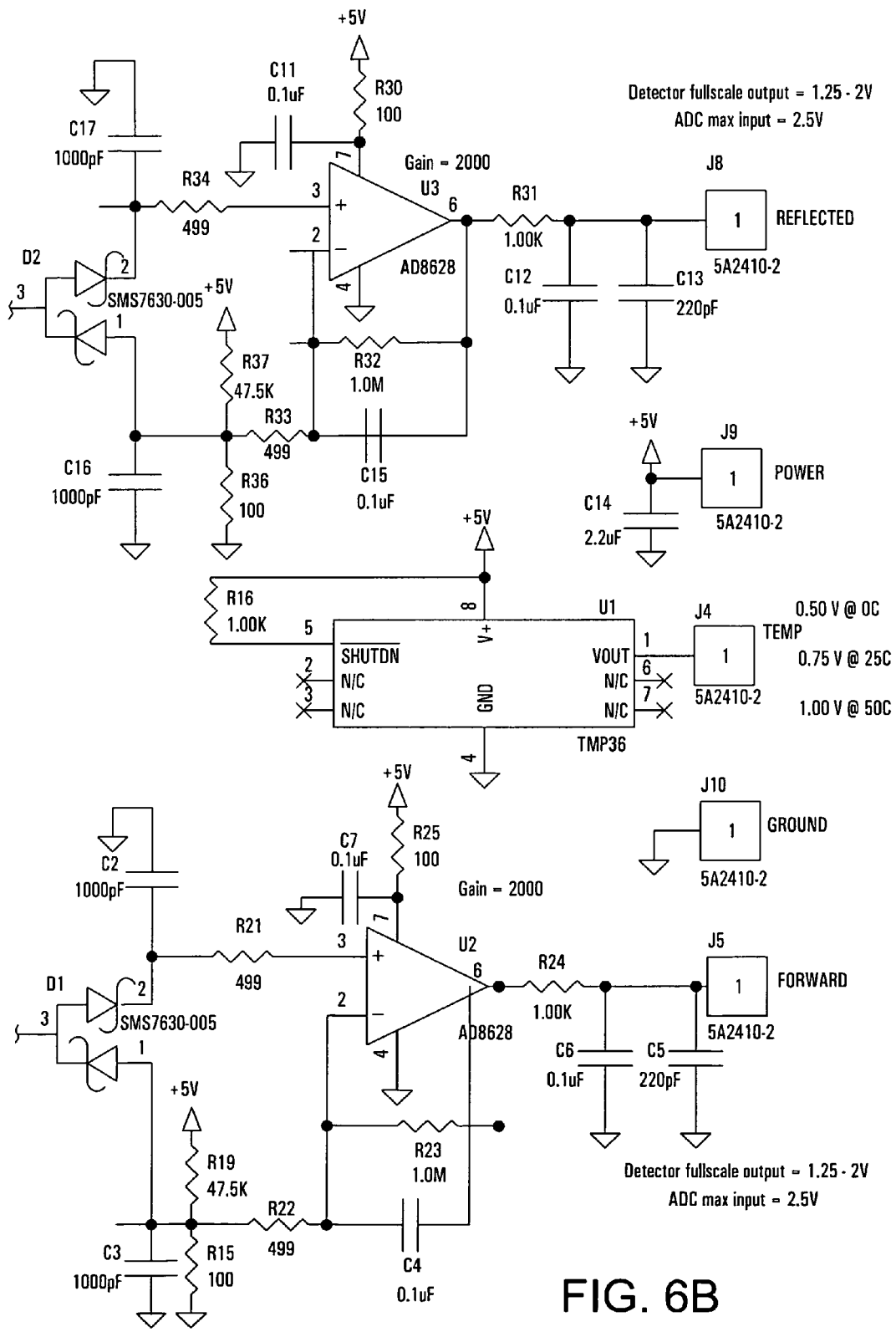
Figure 6C:
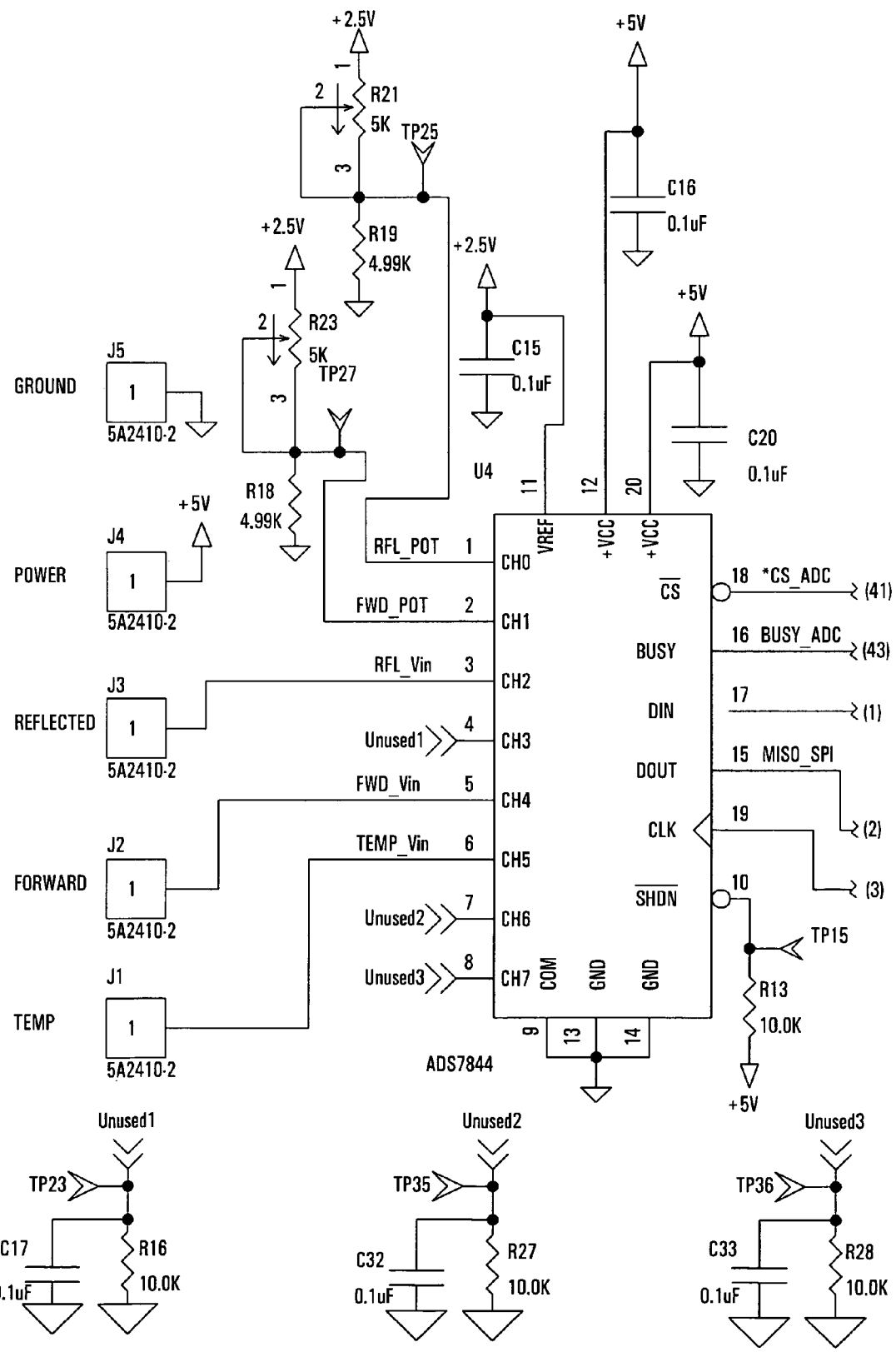
Figure 6D:
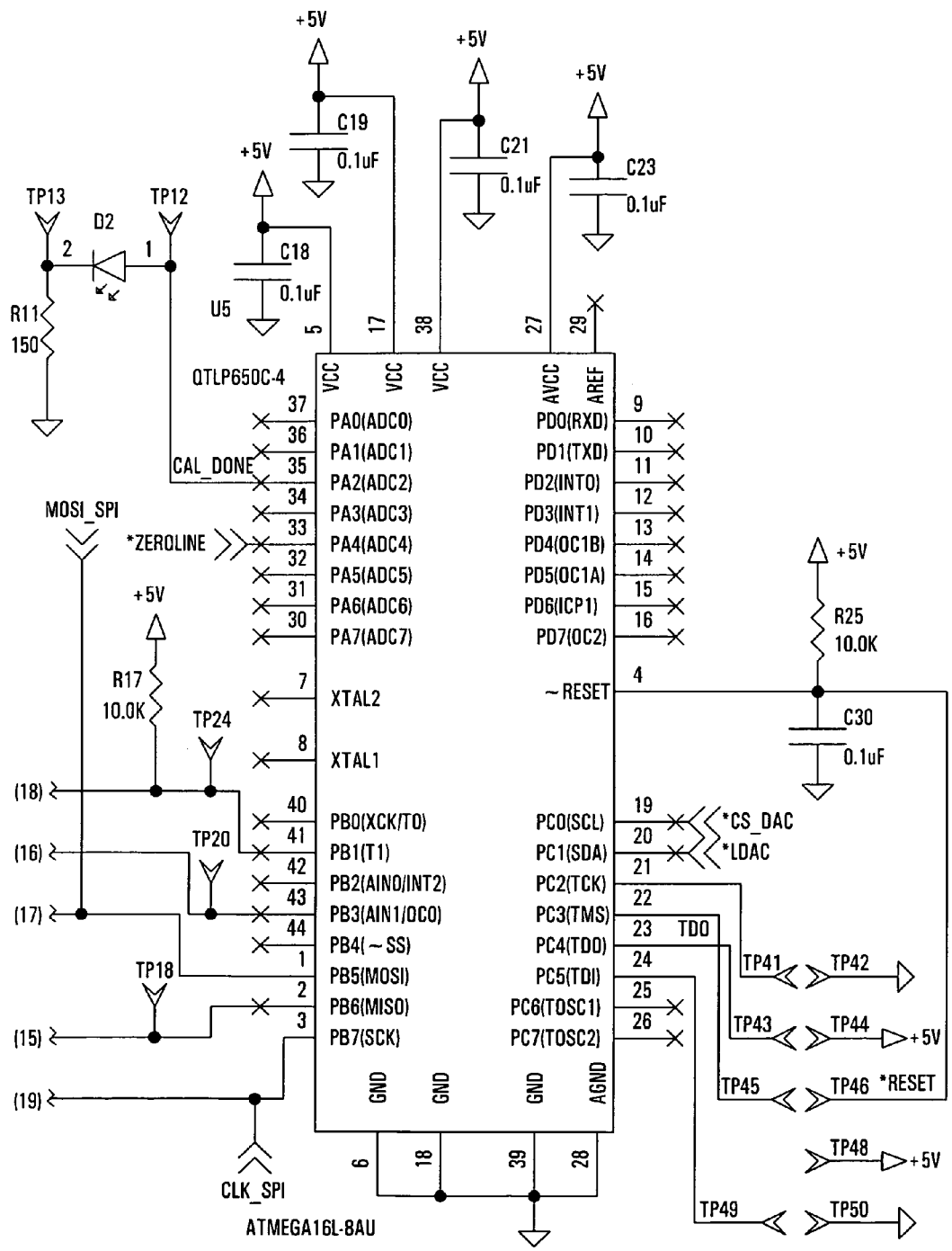
Figure 6E:
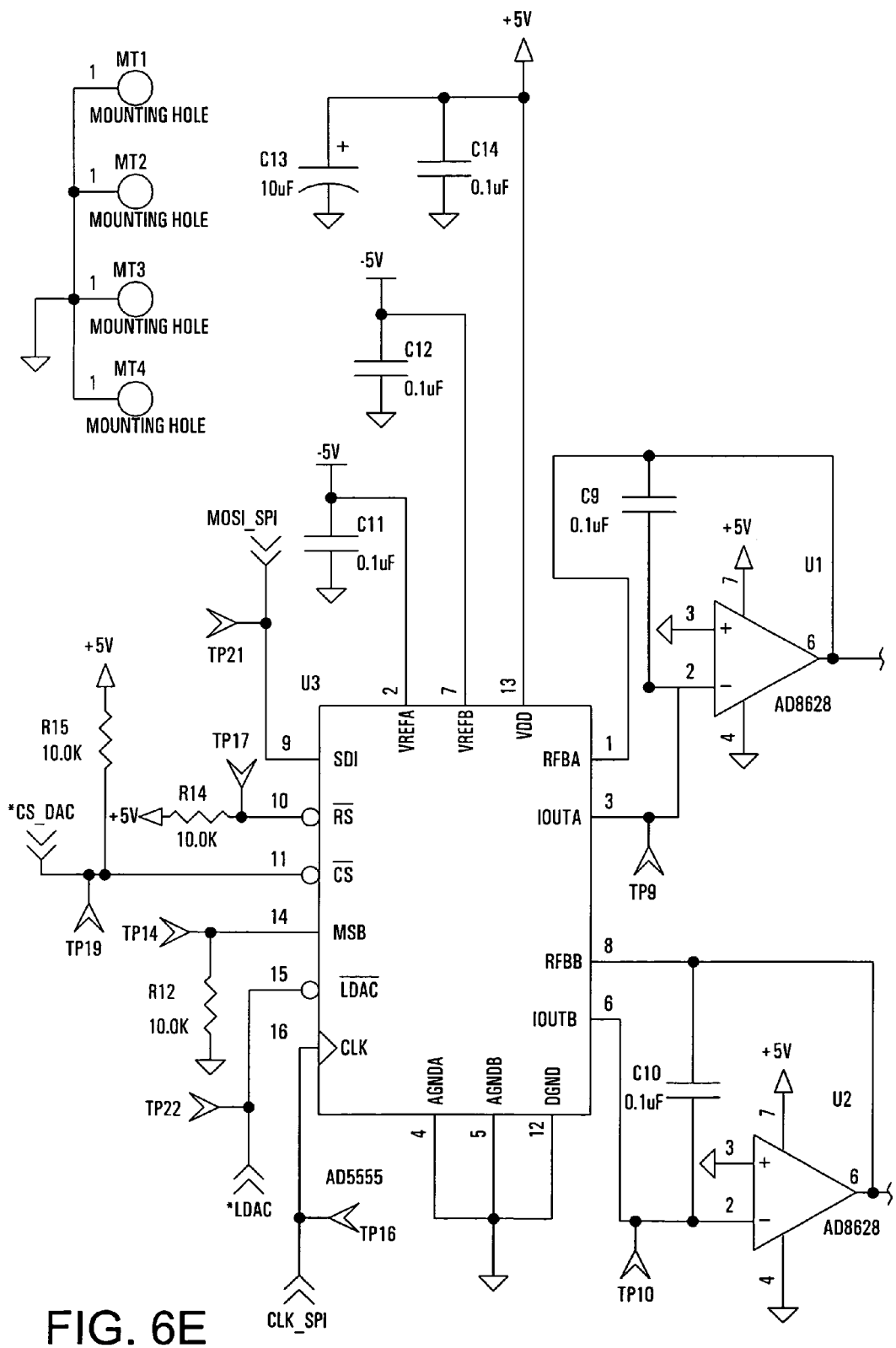
Figure 6F:
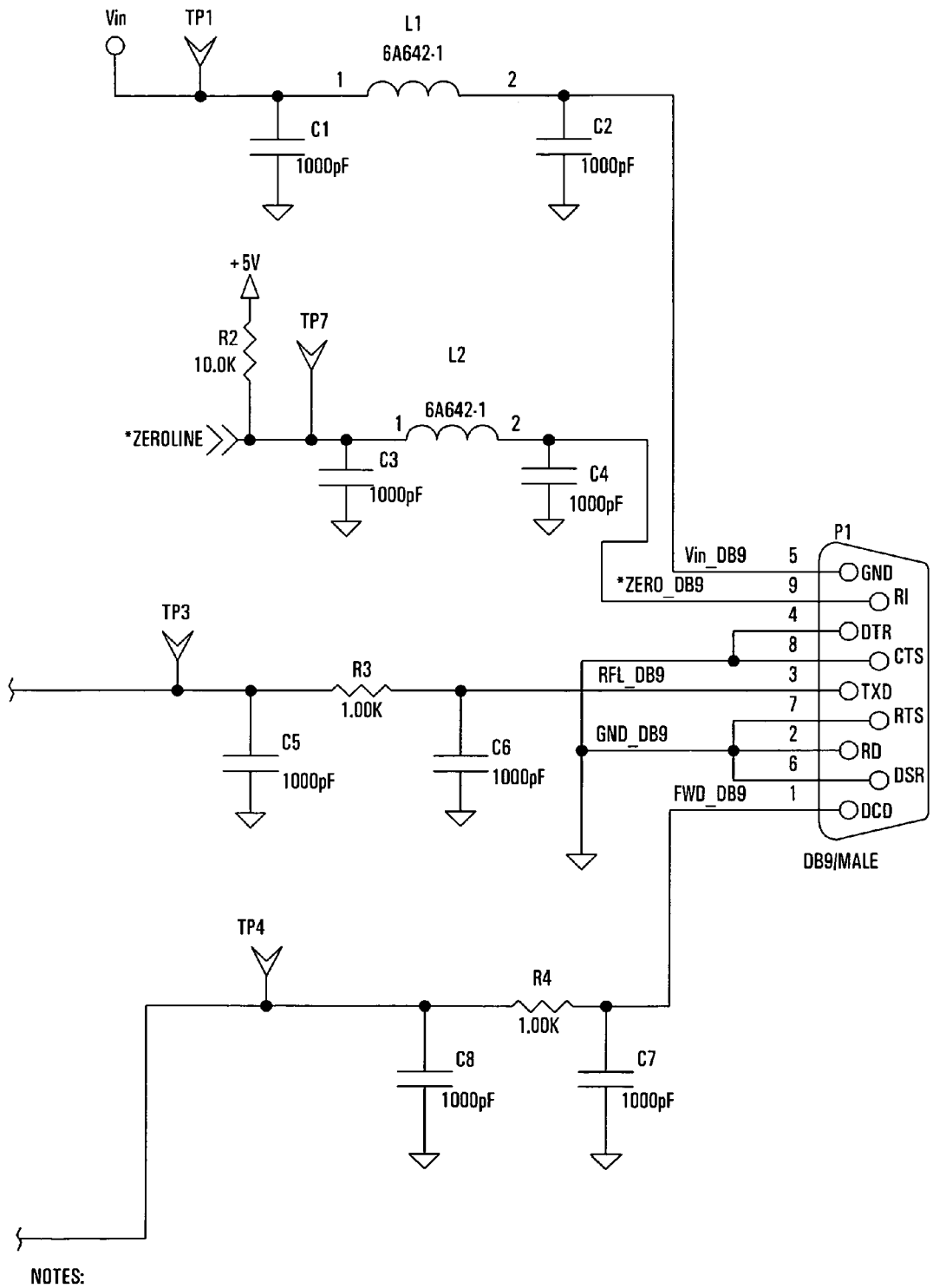
Figure 6G:
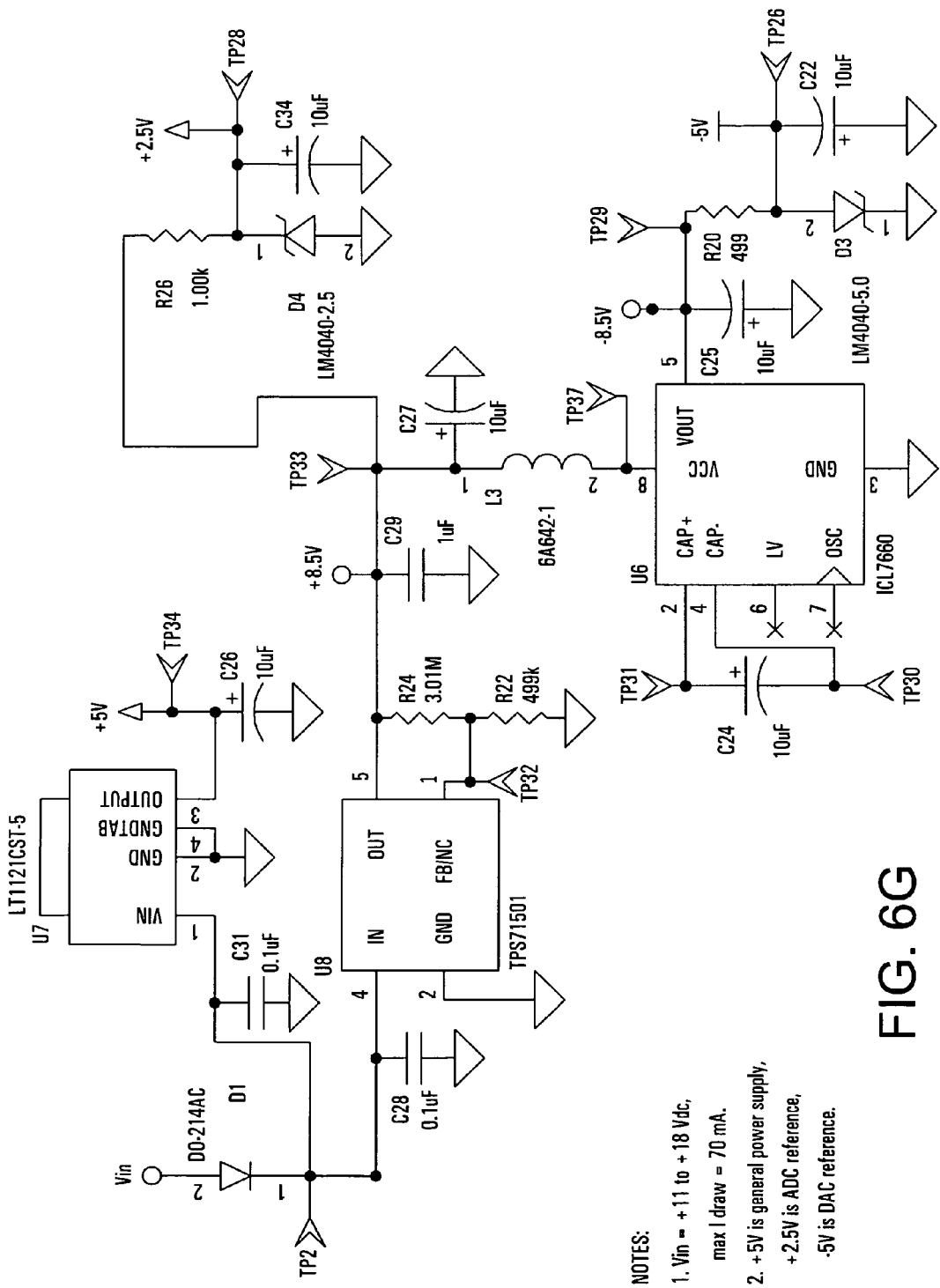
Figure 6H:
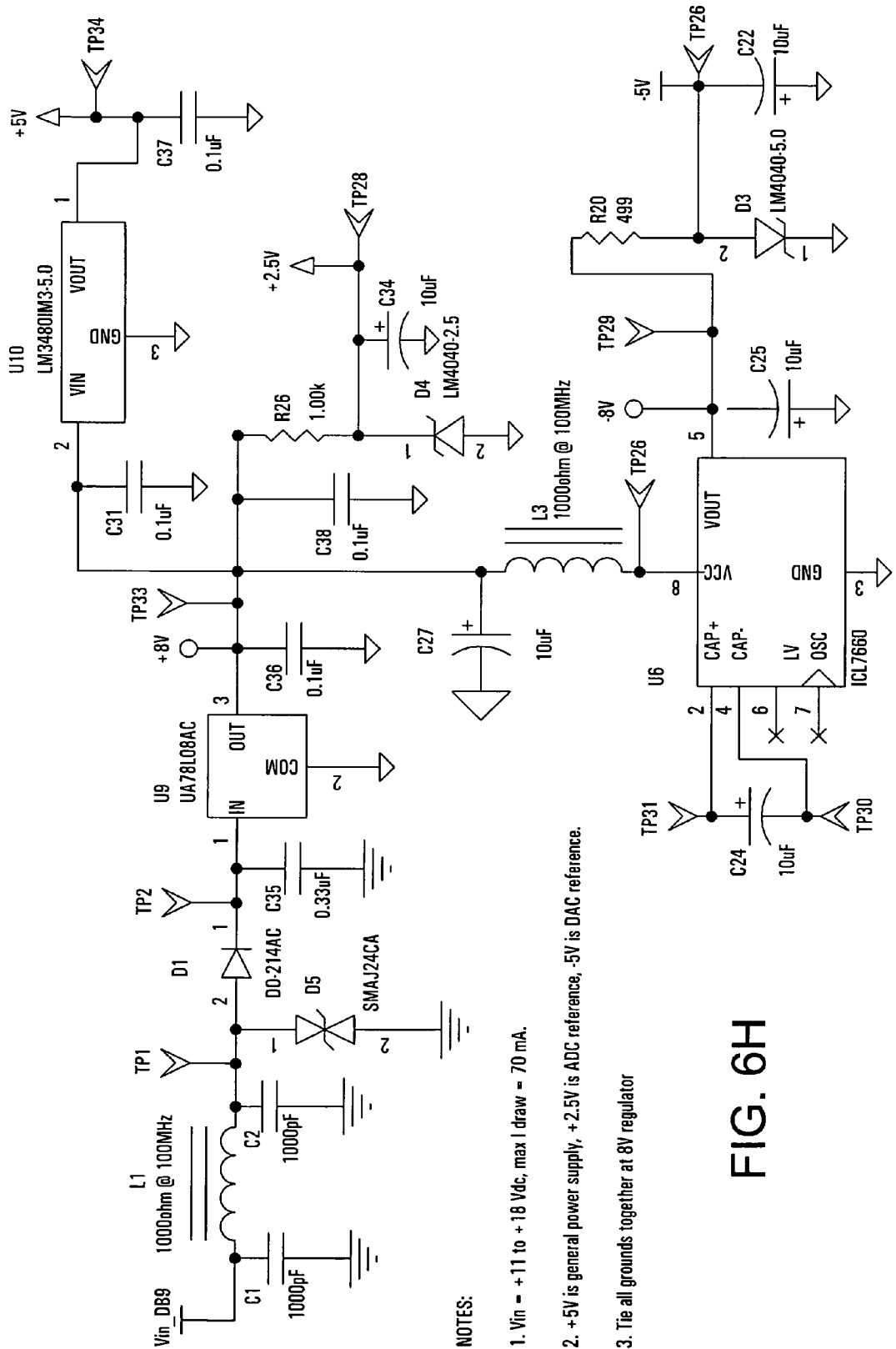

Turning to FIG. 6A-H, FIG. 6A-B are an electrical schematic of the RF board of an embodiment of the transmitter power monitor. FIG. 6C-F are electrical schematics of the logic board of an embodiment of the transmitter power monitor. FIG. 6G is an electrical schematic of the power board of an embodiment of the transmitter power monitor. FIG. 6H is an electrical schematic of the power board of a second embodiment of the transmitter power monitor.

While this invention has been described with respect to particular embodiments thereof, it is apparent that numerous other forms and modifications of this invention will be obvious to those skilled in the art. The appended claims and this invention generally should be construed to cover all such obvious forms and modifications which are within the true spirit and scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "comprises, "comprising," or any other variation thereof, are intended to cover a non-exclusive inclusion, such that a process, method, article, or apparatus that comprises a list of elements does not include only those elements, but may include other elements not expressly listed or inherent to such process, method, article, or apparatus. Further, no element described herein is required for the practice of the invention unless expressly described as "essential" or "critical."

What is claimed is:

1. A power monitor comprising:
    a coupler configured to sample radio frequency ("RF") power propagating in one direction on a transmission line between a RF transmitter and an antenna, said RF power having a level, said coupler is configured to generate a RF voltage proportional to said RF power level;
    a power splitter configured to receive said RF voltage and output said RF voltage to a test port and a detector; said test port having a known mathematical relationship with said transmission line; said test port is configured to connect to a reference power meter;
    said detector is configured to convert said RF voltage to an analog DC voltage;
    a calibration adjustment configured to output a signal;
    an analog to digital converter configured to receive and convert said analog DC voltage and said calibration adjustment signal into a digitized DC voltage and a digitized calibration adjustment signal, said analog to digital converter sends said digitized DC voltage and said digitized calibration adjustment signal to a correction circuit;
    said correction circuit is configured to apply a gain ratio correction to said digitized DC voltage, thereby producing a corrected digitized DC voltage, said correction circuit is further configured to output said corrected digitized DC voltage to a digital to analog converter, said gain ratio correction is dictated by said digitized calibration adjustment signal;
    said digital to analog converter is configured to convert said corrected digitized DC voltage into a corrected DC voltage;
    a power calibrated output configured to output said corrected DC voltage;
    wherein said a power calibrated output is configured to output said corrected DC voltage to a power display having a reading;
    wherein said calibration adjustment is adjusted by:
        connecting a reference power meter to said test port;
        using said reference power meter to obtain a RF power level measurement reading from said transmission line while said RF transmitter is broadcasting live;
        comparing said RF power level measurement reading with said power display reading, wherein said power display is configured to display a full scale power reading;
        when said power display reading is not within +/−1% of said RF power level measurement reading, adjusting the output of said calibration adjustment such that said power display reading is within +/−1% of said RF power level measurement reading.

2. The power monitor of claim 1, wherein the step of connecting a reference power meter to said test port includes inputting said known mathematical relationship between said transmission line and said test port into said reference power meter.

3. The power monitor of claim 1, further including a buffer between said digital to analog converter and said power calibrated output; an amplifier configured to amplify said analog DC voltage for processing by said analog to digital converter.

4. The power monitor of claim 1, wherein said correction circuit comprises an integrated circuit.

5. The power monitor of claim 1, wherein said digital to analog converter and analog to digital converter are incorporated in said correction circuit.

6. The power monitor of claim 1, further comprising a temperature sensor having an output, whereby said correction circuit uses the output of said temperature sensor to apply a temperature correction to said digitized DC voltage; means for calculating zero power offsets introduced by the circuitry of said power monitor and applying a zero power offset correction to said digitized DC voltage.

7. The power monitor of claim 1, wherein said RF power propagating in one direction on said transmission line is forward RF power.

8. The power monitor of claim 1, wherein said RF power propagating in one direction on said transmission line is reflected RF power.

9. A power monitor comprising:
    a coupler configured to sample radio frequency ("RF") power propagating in one direction on a transmission line between a RF transmitter and an antenna, said RF power having a level, said coupler is configured to generate a RF voltage proportional to said RF power level;
    a power splitter configured to receive said RF voltage and output said RF voltage to a test port and a detector; said test port having a known mathematical relationship with said transmission line; said test port is configured to connect to a reference power meter;
    said detector is configured to convert said RF voltage to a DC voltage;
    a calibration adjustment configured to output a signal;
    a correction circuit configured to apply a gain ratio correction to said DC voltage, thereby producing a corrected DC voltage, said gain ratio correction is dictated by said calibration adjustment signal;
    a power calibrated output configured to output said corrected DC voltage;
    wherein said a power calibrated output is configured to output said corrected DC voltage to a power display having a reading;
    wherein said calibration adjustment is adjusted by:
        connecting a reference power meter to said test port;
        using said reference power meter to obtain a RF power level measurement reading from said transmission line while said RF transmitter is broadcasting live;
        comparing said RF power level measurement reading with said power display reading, wherein said power display is configured to display a full scale power reading;
        when said power display reading is not within +/−1% of said RF power level measurement reading, adjusting the output of said calibration adjustment such that said power display reading is within +/−1% of said RF power level measurement reading.

10. The power monitor of claim 9, wherein the step of connecting a reference power meter to said test port includes inputting said known mathematical relationship between said transmission line and said test port into said reference power meter.

11. The power monitor of claim 9, wherein said correction circuit comprises an integrated circuit.

12. The power monitor of claim 9, further comprising a temperature sensor having an output, whereby said correction circuit uses the output of said temperature sensor to apply a temperature correction to said digitized DC voltage; means for calculating zero power offsets introduced by the circuitry of said power monitor and applying a zero power offset correction to said digitized DC voltage.

13. The power monitor of claim 9, wherein said RF power propagating in one direction on said transmission line is forward RF power.

14. The power monitor of claim 9, wherein said RF power propagating in one direction on said transmission line is reflected RF power.

* * * * *